(12) United States Patent
Narayan et al.

(10) Patent No.: US 6,518,742 B1
(45) Date of Patent: Feb. 11, 2003

(54) SYSTEM AND METHOD FOR ANALYZING FORCED AND UNFORCED OSCILLATORS

(75) Inventors: Onuttom Narayan, Santa Cruz, CA (US); Jaijeet S. Roychowdhury, Jersey City, NJ (US)

(73) Assignees: Lucent Technologies Inc., Murray Hill, NJ (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 09/430,630

(22) Filed: Oct. 29, 1999

(51) Int. Cl.[7] .................. G01R 23/02; G01R 23/16; G01R 23/00

(52) U.S. Cl. ................. 324/76.39; 324/76.19; 324/76.21

(58) Field of Search ............ 324/76.19, 76.21, 324/76.39, 76.62; 702/198, 189

(56) References Cited

U.S. PATENT DOCUMENTS 4,024,498 A * 5/1977 McIntosh ............... 714/700
5,394,346 A * 2/1995 Milsom ................. 364/578

OTHER PUBLICATIONS

J. Roychowdhury. Efficient Methods for Simulating highly Nonlinear Multy–Rate Circuits. IEEE, Jun. 1997.*

O. Narayan and J. Roychowdhury. Analysing Forced Oscillator with Multiple Time Scales. Bell Lab., 1998.*

H. G. Brachtendorf, G. Welsch, R. Laur, A. Bunse–Gerstner; "Numerical Steady State Analysis of Electronic Circuits Driven by Multi–Tone Signals," Electrical Engineering 79 (1996) ©Springer–Verlag 1996, pp. 103–112.

Jaijeet Roychowdhury; Bell Laboratories, Murray Hill, USA; "Efficient Methods For Simulating Highly Nonlinear Multi–Rate Circuits," Design Automation Conference®, Coyright ©1997 by the Association for Computing Machinery, Inc., DAC 97– 06/97, Anaheim, CA USA, pp. 269–274.

Jaijeet Roychowdhury; Bell Laboratories, Murray Hill, New Jersey; "Analysing Circuits With Widely Separated Time Scales Using Numerical PDE Methods," pp. 1–25, May 1999.

Yousef Saad, University of Minnesota; "Iterative Methods For Sparse Linear Systems," Copyright ©1996 by PWS Publishing Company, Table of Contents.

Roland W. Freund, "Reduced–order Modeling Techniques Based on Krylov Subspaces and Their Use in Circuit Simulation," dated Feb. 17, 1998; Invited survey paper for Applied and Computational Control, Signals, and Circuits, pp. 1–56.

Robert C. Melville, Peter Feldmann, Jaijeet Roychowdhury; AT&T Bell Laboratories, Murray Hill, New Jersey; "Efficient Multi–tone Distortion Analysis of Analog Integrated Circuits," IEEE 1995 Custom Integrated Circuits Conference, 0–7803–2584–2/95 ©1995 IEEE, pp. 241–244.

(List continued on next page.)

*Primary Examiner*—Michael Sherry
*Assistant Examiner*—Paresh Patel
(74) *Attorney, Agent, or Firm*—Hitt, Gaines & Boisbrun, P.C.

(57) ABSTRACT

A system for, and method of, analyzing a forced or unforced oscillator. In one embodiment the system includes: (1) a transformation circuit that transforms a frequency-modulated waveform representing an output of the oscillator into a function based on at least two time scales and (2) a numeric analyzer, associated with the transformation circuit, that warps at least one of the at least two time scales and thereafter numerically analyzes the function to determine a frequency thereof.

17 Claims, 16 Drawing Sheets

OTHER PUBLICATIONS

Peter Feldmann, Bob Melville, David Long; AT&T Bell Laboratories, Murray Hill, New Jersey; "Efficient Frequency Domain Analysis of Large Nonlinear Analog Circuits," IEEE 1996 Custom Integrated Circuits Conference, 0–7803–3177–6 ©1996 IEEE, pp. 461–464.

Jaijeet Roychowdhury, David Long, and Peter Feldmann, Senior Member, IEEE; Bell Laboratories, Murray Hill, New Jersey; "Cyclostationary Noise Analysis Of Large RF Circuits with Multitone Excitations," IEEE Journal of Solid–State Circuits, vol. 33, No. 3, Mar. 1998, 0018–9200/98 ©1998 IEEE, pp. 324–336.

* cited by examiner

SYSTEM AND METHOD FOR ANALYZING FORCED AND UNFORCED OSCILLATORS

TECHNICAL FIELD OF THE INVENTION

The present invention is directed, in general, to systems and methods for performing circuit analysis and, more specifically, to a system and method for analyzing a circuit that incorporates a either forced or unforced oscillators.

BACKGROUND OF THE INVENTION

Oscillatory behavior is ubiquitous in nature and can be found in a variety of electrical, mechanical, gravitational and biological systems. In electronic oscillators, salient examples include voltage-controlled oscillators (VCOs), phase-locked loops (PLLs), frequency dividers and sigma delta modulators. In the presence of external forcing, these systems can exhibit complex dynamics, such as frequency modulation, entrainment or mode locking, period multiplication and even chaos behavior. Despite their universality, our understanding of such systems is far from complete, and it is difficult to predict the response of a general autonomous system in a satisfactory and reliable manner.

Historically, many previous oscillator investigations have been viewed from a practical design perspective wherein their analyses have typically applied purely linear concepts to obtain simple design formulas. However, linear models are not qualitatively adequate for practical oscillators, since nonlinearity is essential for their orbital stability. Nonlinear analyses have largely concentrated on polynomially-perturbed linear oscillators with sophisticated studies focusing typically on mode locking and transitions to chaos. Relatively little attention has been paid to phenomena like FM-quasiperiodicity, even though they are of great importance in communication applications.

A current analytical technique is the multiple-variable expansion procedure, which is useful for simple harmonic oscillators that do not have external forcing and exhibit small nonlinear perturbations. The dependence on the strength of the nonlinearity is typically different in different parts of the solution, causing multiple time variables to be introduced to obtain a tractable perturbation theory. Unfortunately, this method is intrinsically a perturbation approach, wherein even convergence of the solution series is not guaranteed.

For real oscillators and more complex systems, numerical simulation has been the predominant means of predicting detailed responses. However, simulation of oscillators presents unique difficulties that are absent in non-autonomous systems. A fundamental problem is the intrinsic phase instability of oscillators, which is manifested as the absence of a time reference. In this case, numerical errors tend to grow and the phase error often increases without bound in the course of the numerical solution. For unforced oscillators in periodic steady state, boundary-value methods such as shooting and harmonic balance can be used to obtain both the time period and the steady-state solution. Neither shooting nor harmonic balance can be applied, however, to forced oscillators with FM-quasiperiodic responses, as they require an impractically large number of time-steps or variables. In practice, the separation of the time scales is often reduced artificially to make the problem tractable. Such ad hoc approaches can lead to qualitatively misleading results.

Accordingly, what is needed in the art is a way to transform a frequency modulated quasiperiodic waveform, such as that from an oscillator, to enhance and simplify its analysis.

SUMMARY OF THE INVENTION

To address the above-discussed deficiencies of the prior art, the present invention provides a system for, and method of, analyzing a forced or unforced oscillator. In one embodiment the system includes: (1) a transformation circuit that transforms a frequency-modulated waveform representing an output of the oscillator into a function based on at least two time scales and (2) a numeric analyzer, associated with the transformation circuit, that warps at least one of the at least two time scales and thereafter numerically analyzes the function to determine a frequency thereof.

The present invention therefore introduces the broad concept of causing at least one of the multiple time scales to vary (warp) Warping of the time scale causes the oscillator output waveform to become quasiperiodic, greatly reducing the numeric analysis required to determine frequencies and substantially eliminating the error that results when approximations (that otherwise would be required were the time scale to be fixed) are rendered unnecessary. Warping as used here means to stretch or squeeze the time axis by different amounts at different times in order to make the density of the oscillator output waveform undulations uniform.

In one embodiment of the present invention, a first of the at least two time scales is at least three times faster than a second of the at least two time scales. In an embodiment to be illustrated and described, the time scales are separated greatly, perhaps on the order of 50 times.

In one embodiment of the present invention, the function is a multirate partial differential equation (MPDE). Those skilled in the pertinent art are familiar with MPDEs and their solutions.

In one embodiment of the present invention, the numeric analyzer analyzes the function by performing a Fourier transform thereon. Those skilled in the pertinent art are familiar with Fourier transforms and their use in analyzing oscillators in a frequency domain. Of course, the present invention also encompasses time-domain analysis.

In one embodiment of the present invention, the frequency-modulated waveform comprises a plurality of voltage samples. Alternatively, the waveform may be represented by an equation.

In one embodiment of the present invention, the oscillator is a forced oscillator. Alternatively, the oscillator may be unforced. The present invention provides a general method of solution for both forced and unforced oscillators.

In one embodiment of the present invention, the oscillator is a voltage controlled oscillator. Of course, those skilled in the pertinent art will perceive a wide variety of electrical, mechanical, gravitational and biological applications for the system and method of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
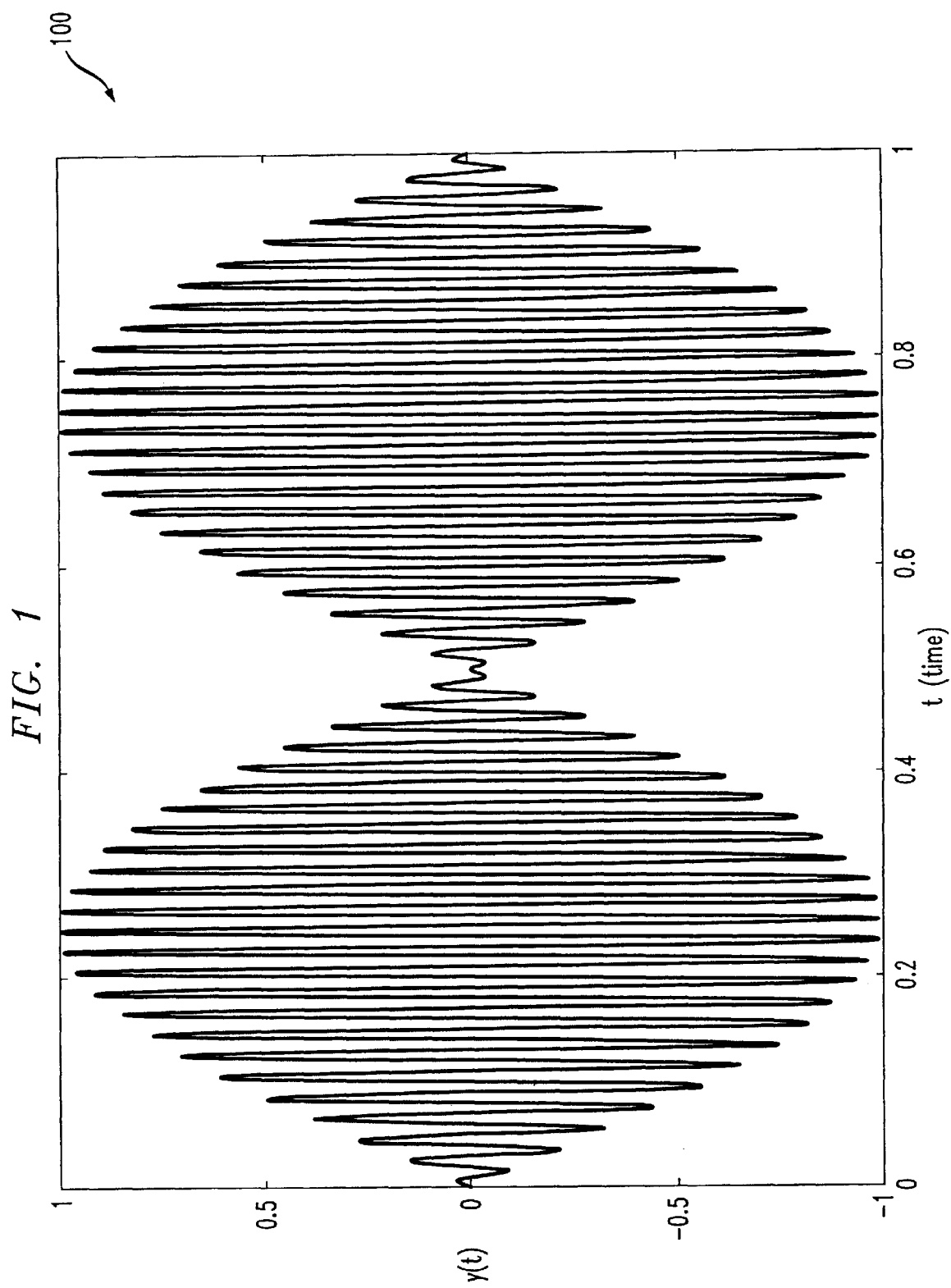
FIG. 1 illustrates a waveform showing a simple two-tone quasiperiodic signal.

Referring initially to FIG. 1, illustrated is a waveform 100 showing a simple two-tone quasiperiodic signal. The waveform 100 may be represented by:

$$y(t) = \sin\left(\frac{2\pi}{T_1}t\right)\sin\left(\frac{2\pi}{T_2}t\right), \quad T_1 = 0.02s, \ T_2 = 1s \quad (1)$$

The two tones are at frequencies:

$$f_1 = \frac{1}{T_1} = 50 \text{ Hz and } f_2 = \frac{1}{T_2} = 1 \text{ Hz}.$$

There are 50 fast-varying sinusoids of period $T_1$=0.02 s modulated by a slow-varying sinusoid of period $T_2$=1 s. Such multi-rate waveforms with two or more "components" varying at widely separated rates arise in many practical situations. These situations include oscillators, mixers, switched-capacitor filters, planetary systems, and combustion engines.

When such signals result from differential-algebraic equation (DAE) systems being solved by numerical integration (i.e., transient simulation), the time-steps taken need to be spaced closely enough that each rapid undulation of y(t) is sampled accurately. If each fast sinusoid is sampled at n points, the total number of time-steps needed for one period of the slow modulation is $$n\frac{T_2}{T_1}.$$

To generate the waveform 100, 15 points were used per sinusoid yielding a total number of 750 samples. This number can be much larger in applications where the rates are more widely separated, such as electronic circuits where separation factors of 1000 or more may be common. Also, while the particular y(t) in (1) can be compactly represented in the frequency domain with only two Fourier components, the same is not true for the product of a sine wave and a square wave. Hence, frequency-domain representations do not, in general, solve the problem of inefficient numerical representation of multirate signals.

Figure 2:
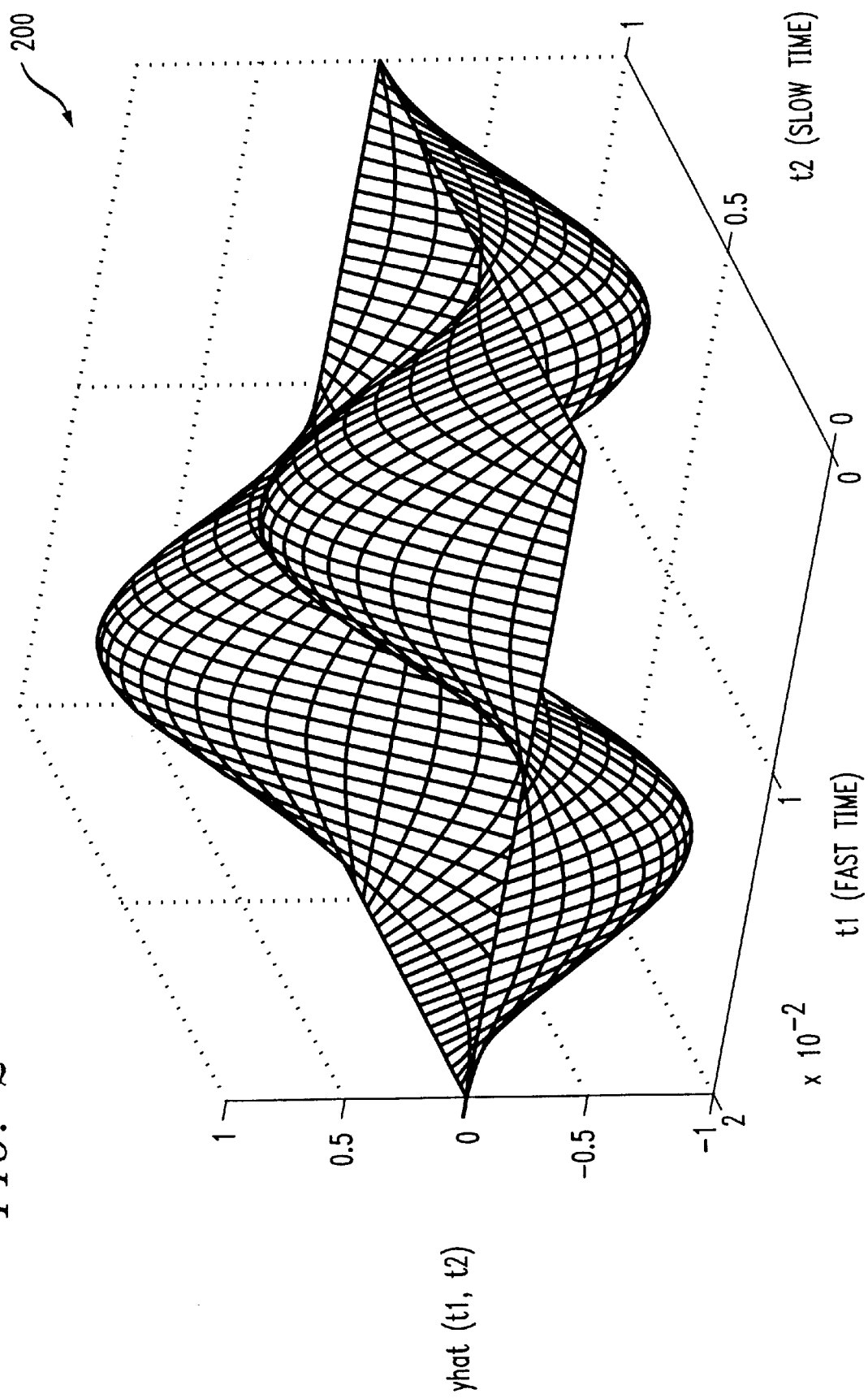
FIG. 2 illustrates a waveform showing a multivariate representation of y(t) depicted in FIG. 1.

Turning now to FIG. 2, illustrated is a waveform 200 showing a multivariate representation of y(t) depicted in FIG. 1. The multivariate representation of y(t) may be obtained by replacing t with a first variable $t_1$ representing the "fast-varying" parts of t and with a second variable $t_2$ representing the "slow-varying" parts of t. The resulting function, now of two variables, is denoted by $\hat{y}(t_1,t_2)$;

$$\hat{y}(t_1, t_2) = \sin\left(\frac{2\pi}{T_1}t_1\right)\sin\left(\frac{2\pi}{T_2}t_2\right) \quad (2)$$

Note that $\hat{y}(t_1,t_2)$ periodic with respect to both $t_1$ and $t_2$, that is $\hat{y}(t_1+T_1,t_2+T_2)=\hat{y}(t_1,t_2)$. The waveform 200 of $\hat{y}(t_1,t_2)$ on the rectangle $0 \leq t_1 \leq T_1$, $0 \leq t_2 \leq T_2$ is shown in FIG. 2. Because $\hat{y}$ is bi-periodic, this plot repeats over the rest of the $t_1$–$t_2$ plane as will be shown in FIG. 3. Note also that $\hat{y}(t_1,t_2)$ does not have many undulations, unlike the waveform 100 representing y(t) in FIG. 1. Unlike the waveform 100, the waveform 200 can be represented by relatively few points, which do not depend on the relative values of $T_1$ and $T_2$. The waveform 200 was plotted with 225 samples on a uniform 1515 grid, which is approximately three times fewer than for the waveform 100 in FIG. 1. This saving increases with increasing separation of the periods $T_1$ and $T_2$. Note further that it is easy to recover y(t) from $\hat{y}(t_1,t_2)$, simply by setting $t_1=t_2=t$, and using the fact that $\hat{y}$ is bi-periodic. Given any value of t, the arguments to $\hat{y}$ are given by $t_i$=t mod $T_i$. For example:

$$y(1.952s) = \hat{y}(1.952s, 1.952s)$$
$$= \hat{y}(97T_1 + 0.012s, T_2 + 0.952s)$$
$$= \hat{y}(0.012s, 0.952s)$$

Figure 3:
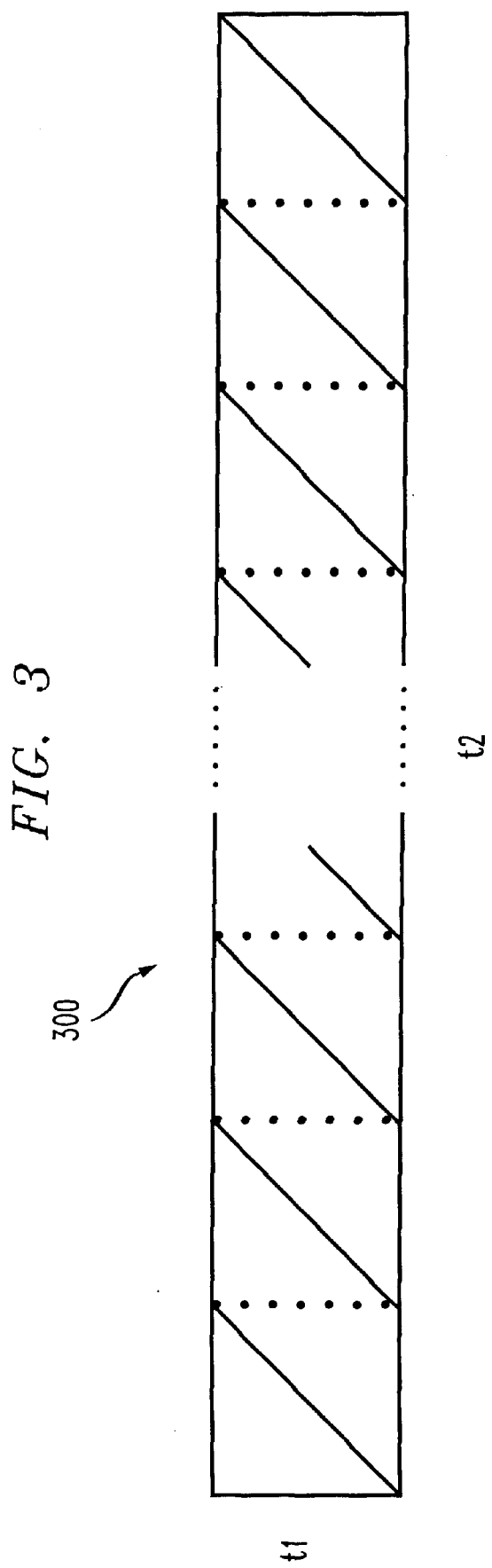
FIG. 3 illustrates a diagram showing a sawtooth path characteristic for increasing t in the $t_1$–$t_2$ plane.

Turning now to FIG. 3, illustrated is a diagram 300 showing a sawtooth path characteristic for increasing t in the $t_1$–$t_2$ plane. Given $\hat{y}(t_1,t_2)$, it is easy to visualize what y(t) looks like. As t increases from zero, the path given by $\{t_i$=t mod $T_i\}$ traces the sawtooth path shown in FIG. 3. By noting how $\hat{y}$ changes as this path is traced in the $t_1$–$t_2$ plane, y(t) can be visualized. When the time-scales are widely separated, inspection of the bivariate waveform directly provides information about the slow and fast variations of y(t) more naturally and conveniently than y(t) itself.

Two important features may be illustrated from the preceding discussion. First, the bivariate form can require far fewer points for a numerical representation than the original quasiperiodic signal. Second, the bivariate form contains all of the information needed to recover the original signal completely. These concepts are the key to the MPDE approach. Background information concerning analyzing non-autonomous systems is discussed in the following: *Numerical Steady State Analysis of Electronic Circuits Driven by Multi-Tone Signals,* by H. G. Brachtendorf, et al., Electrical Engineering (Springer-Verlag), 79:103–112, 1996; *Efficient Methods for Simulating Highly Nonlinear Multi-Rate Circuits,* by J. Roychowdhury, Proc. IEEE DAC, 1997 and *Analyzing Circuits with Widely-Separated Time Scales using Numerical PDE Methods,* by J. Roychowdhury, IEEE Trans. Ckts. Syst.—I: Fund. Th. Appl., 1998. The foregoing publications are incorporated herein by reference.

The basic notion is to solve directly for the compact multi-variate forms of a DAE solution. To achieve this, the DAE is replaced by a closely related multirate partial differential equation (MPDE). By applying boundary conditions to the MPDE and solving it with numerical methods, the multi-variate solutions are obtained efficiently. The univariate solution of the original DAE can be easily computed from the multi-variate solution of the MPDE. Often, however, information of interest can be obtained directly by inspecting the multi-variate solution. Background information concerning these types of solutions are discussed in *Efficient Methods for Simulating Highly Nonlinear Multi-Rate Circuits,* by J. Roychowdhury, Proc. IEEE DAC, 1997 and in *Analyzing Circuits with Widely-Separated Time Scales using Numerical PDE Methods,* by J. Roychowdhury, IEEE Trans. Ckts. Syst.—I: Fund. Th. Appl., 1998. The foregoing publications are incorporated herein by reference.

Figure 4:
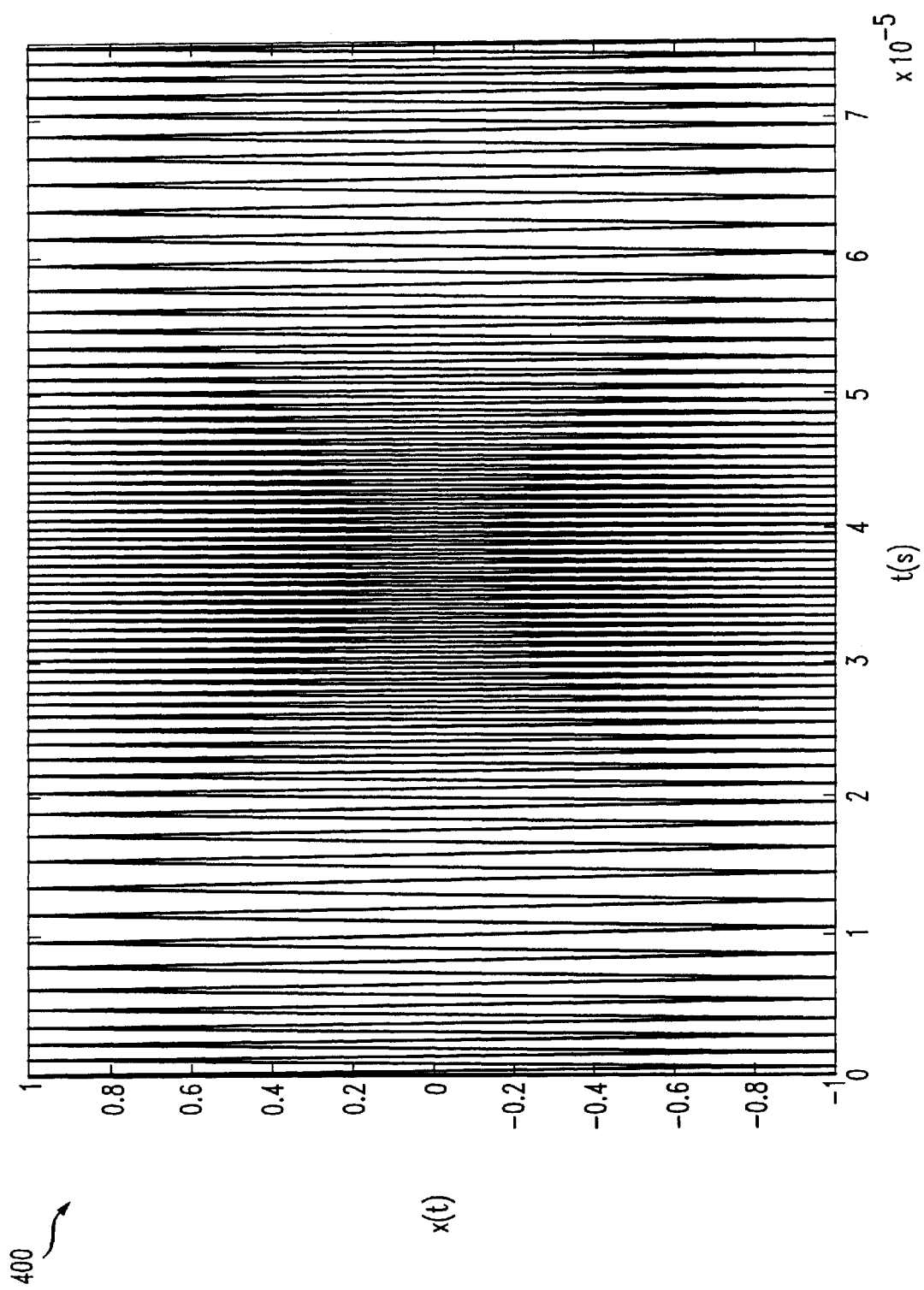
FIG. 4 illustrates a waveform showing a prototypical FM signal.
Figure 5:
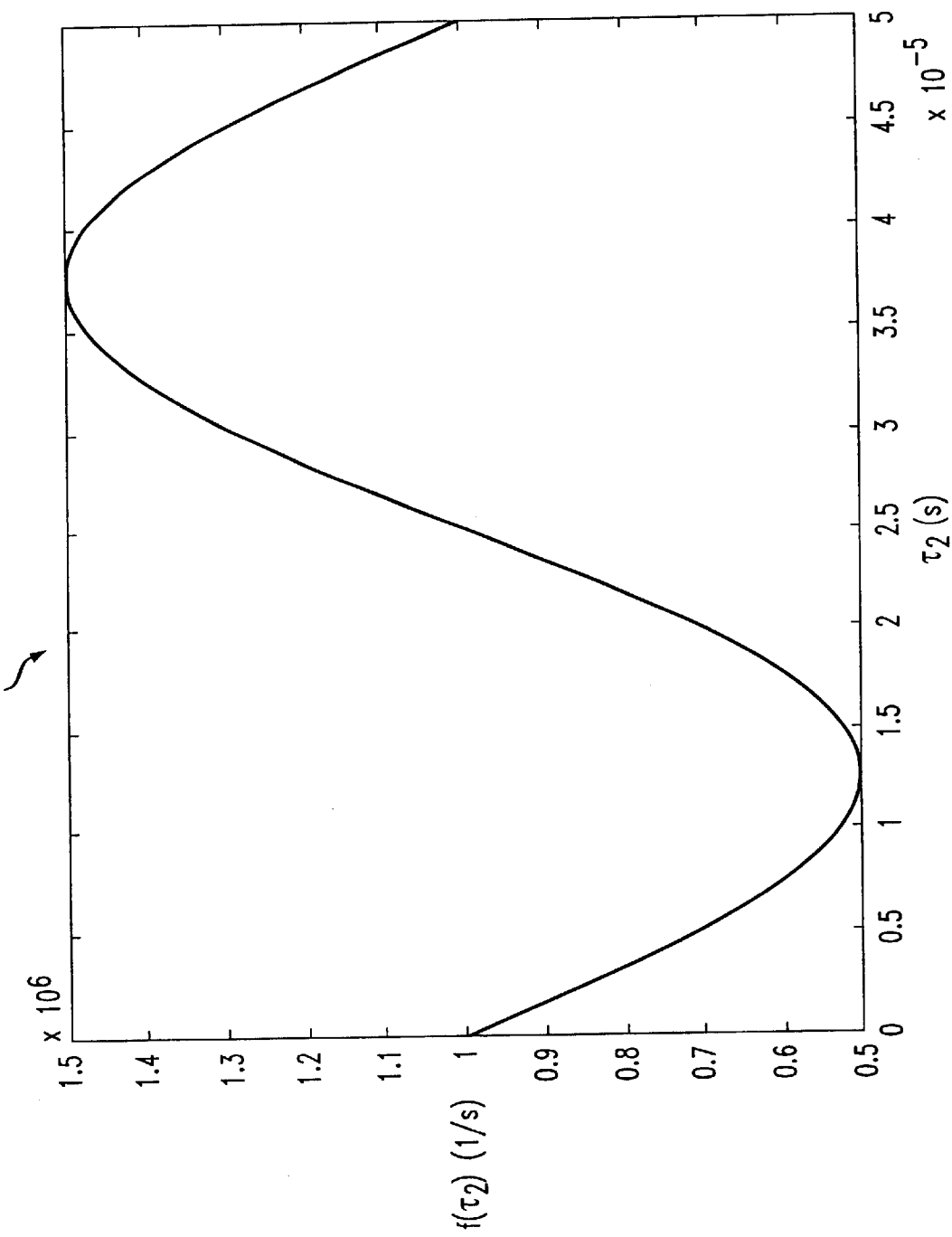
FIG. 5 illustrates a waveform showing a changing instantaneous frequency of the prototypical FM signal.

Turning now to FIG. 4 and FIG. 5, illustrated are a waveform 400 showing a prototypical FM signal and a waveform 500 showing a changing instantaneous frequency of the prototypical FM signal, respectively. When the DAEs under consideration contain autonomous components, FM-quasiperiodicity can be generated. FM, in general, cannot be represented compactly as shown in FIG. 2 wherein the difficulty may be illustrated with an example. Consider the following prototypical FM signal:

$$x(t)=\cos(2\pi f_0 t+k \cos(2\pi f_2 t)), f_0 >> f_2 \qquad (3)$$

with instantaneous frequency $$f(t)=f_0-kf_2 \sin(2\pi f_2 t). \qquad (4)$$

The variable x(t) is plotted in FIG. 4 as the waveform 400 for $f_0=1$ MHz, $f_2=20$ KHz, and a modulation index k=8. The instantaneous frequency f(t) is plotted in FIG. 5 as the waveform 500.

Figure 6:
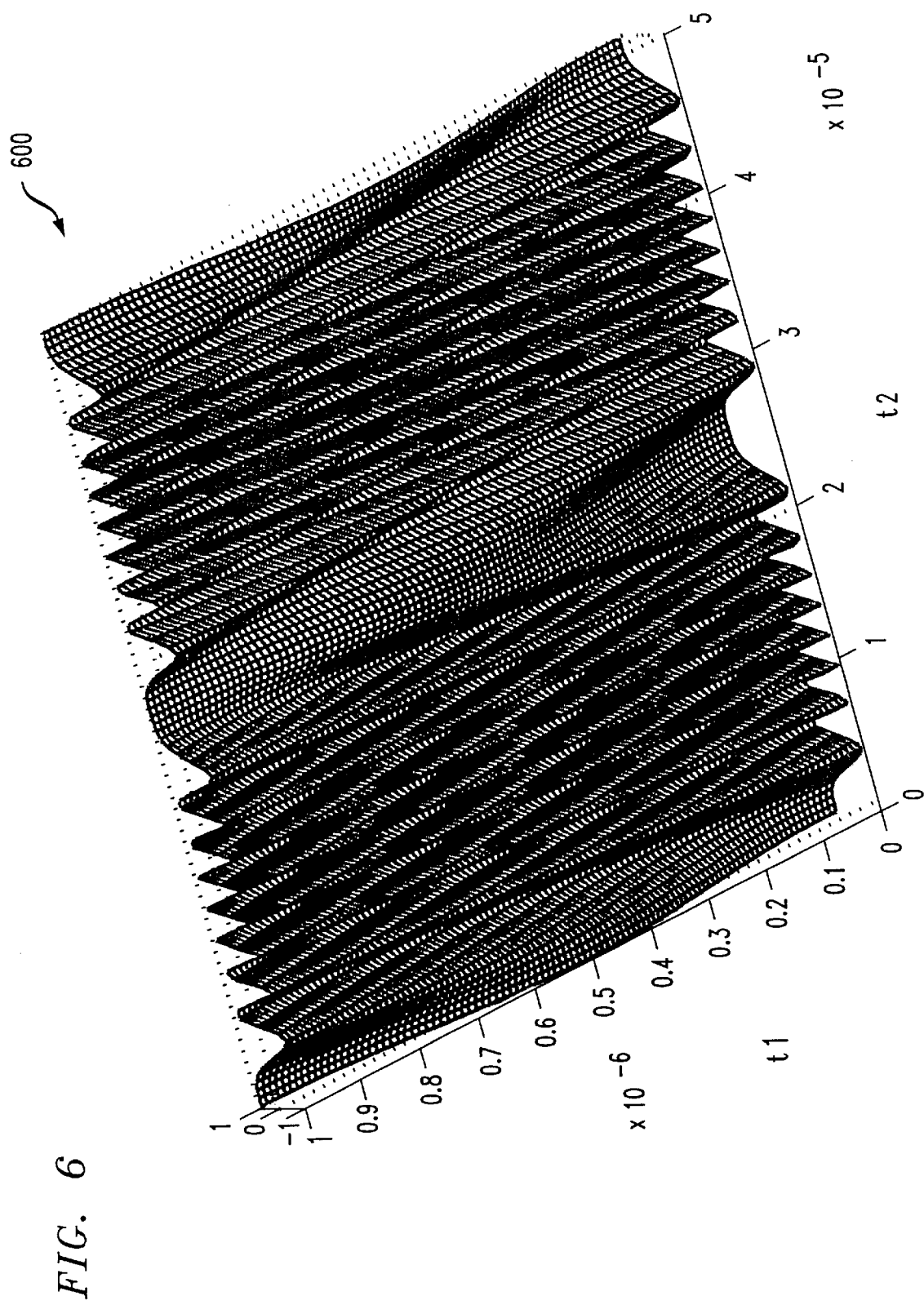
FIG. 6 illustrates a waveform of an unwarped bivariate representation of the prototypical FM signal of FIG. 4.

Turning now to FIG. 6, illustrated is a waveform 600 of an unwarped bivariate representation of the prototypical FM signal of FIG. 4. Following the same approach as for (1), the bivariate representation can be defined to be:

$$\hat{x}_1(t_1,t_2)=\cos(2\pi f_0 t_1+k \cos(2\pi f_2 t_2)), \text{ with } x(t)=\hat{x}_1(t,t). \qquad (5)$$

Note that $\hat{x}_1$ periodic in $t_1$ and $t_2$, hence x(t) is quasiperiodic with frequencies $f_0$ and $f_2$. Unfortunately, $\hat{x}(t_1,t_2)$ illustrated in FIG. 6, is not a simple surface with only a few undulations like FIG. 2. When $k>>2\pi$, i.e., $k \approx 2\pi m$ for some large integer m, then $\hat{x}(t_1,t_2)$ will undergo about m oscillations as a function of $t_2$ over one period $T_2$. In practice, k is often of the order of $$\left\lfloor \frac{f_0}{f_2} \right\rfloor 2\pi,$$

hence this number of undulations can be very large. Therefore it becomes difficult to represent $\hat{x}_1$ efficiently by sampling on a two-dimensional grid. It is also clear, from FIG. 6, that representing (3) in the frequency domain will require a large number of Fourier coefficients to capture the undulations.

A plausible approach towards resolving this representation problem is based on the intuition that FM is a slow change in the instantaneous frequency of a fast-varying signal. In the multivariate representation (2), the high-frequency component is the inverse of $T_1$, the time-period along the $t_1$ (fast) time axis. Therefore, the FM solutions can be captured by making this time-period change along the slow time axis $t_2$. That is, change $T_1$ to a periodic function $T_1(t_2)$ making it periodic with period $T_2$. Unfortunately, it can be shown that FM-quasiperiodicity in a DAE cannot be captured by making $T_1$ a function of $t_2$. Additional background information is discussed in *Analyzing Circuits with Widely-Separated Time Scales using Numerical PDE Methods,* by J. Roychowdhury, IEEE Trans. Ckts. Syst.—I: Fund. Th. Appl. The foregoing publication is incorporated herein by reference.

It is easy to see qualitatively why this is the case. Although FIG. 2 and FIG. 6 show the signal over only one period in each of the two time directions, the bivariate form is actually periodic over the entire $t_1-t_2$ plane. However, making the time-period $T_1$ a function $T_1(t_2)$ turns the rectangular domain $[0,T_1] \times [0,T_2]$ of FIG. 2 and FIG. 6 into a non-rectangular domain of variable width. While it is possible to obtain a periodic function on the $t_1-t_2$ plane by placing rectangular boxes side by side to tile the entire plane, it is obvious that this cannot be done with boxes of variable width.

Figure 7:
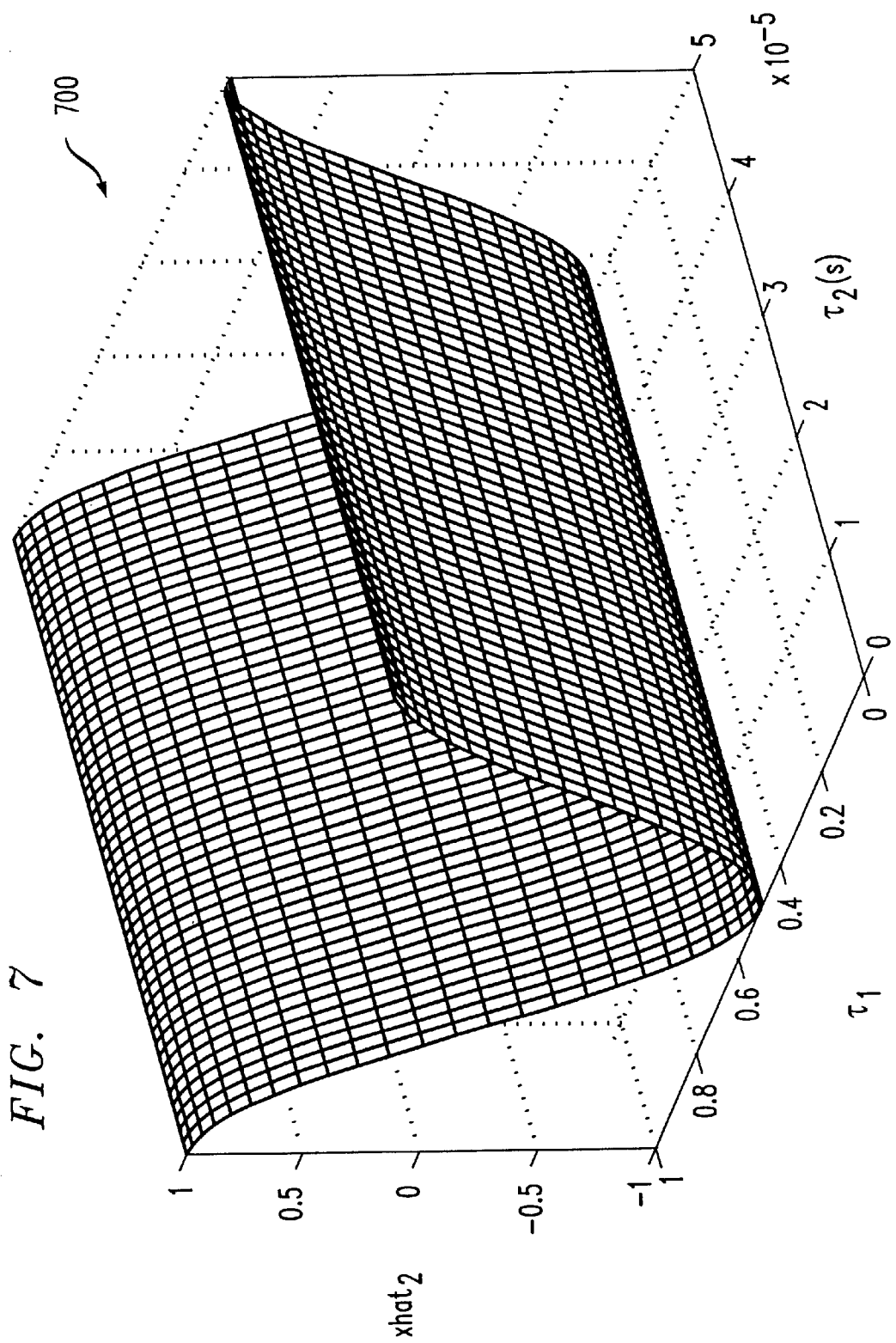
FIG. 7 illustrates a waveform showing a warped bivariate representation of an FM signal.
Figure 8:
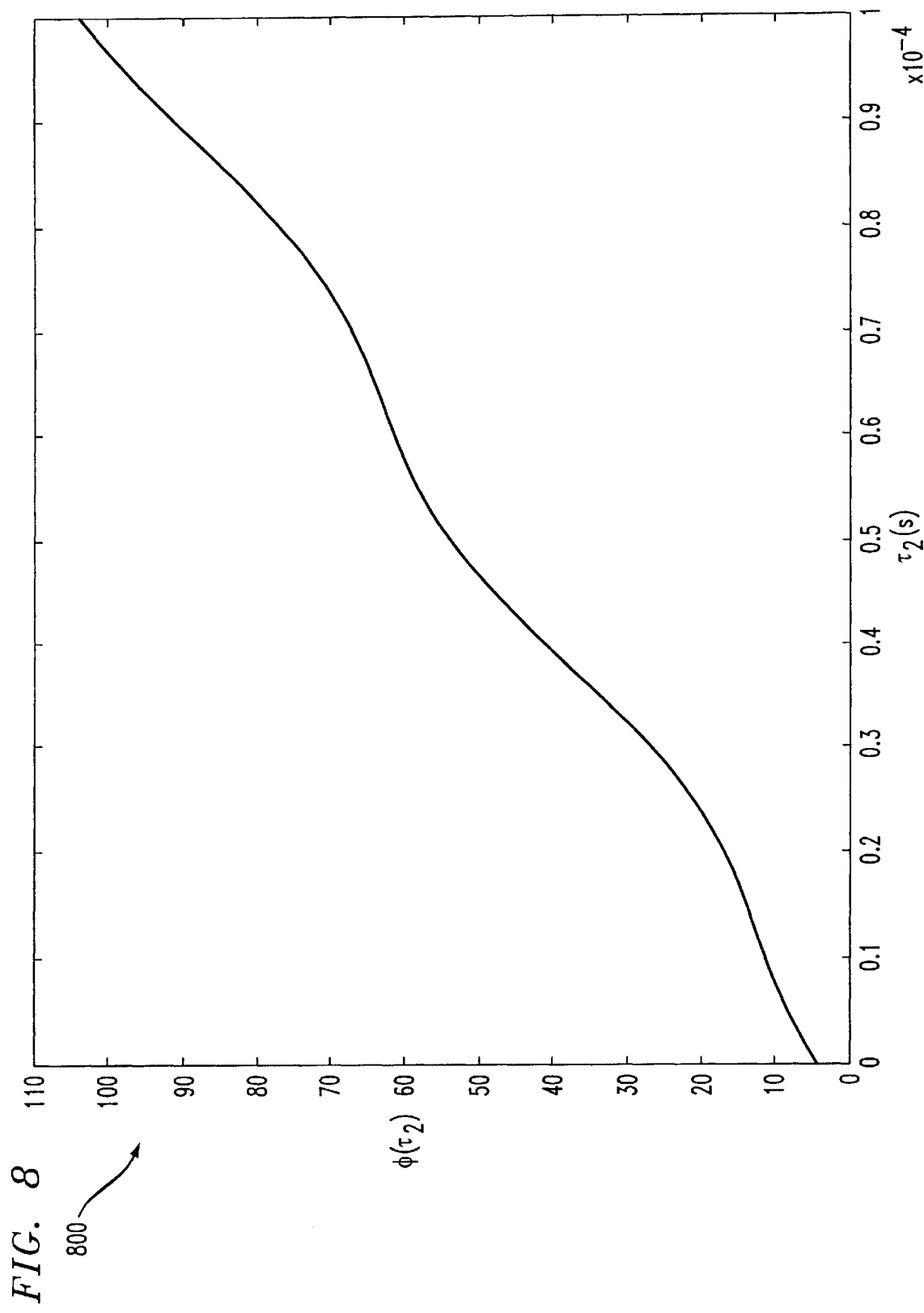
FIG. 8 illustrates a waveform showing a time warping function.

Turning now to FIG. 7 and FIG. 8, illustrated are a waveform 700 showing a warped bivariate representation of an FM signal and a waveform 800 showing a time warping function, respectively. A new approach resolves the problem discussed in FIG. 6 by preserving the rectangular shape of the domain boxes and bending the path along which y(t) is evaluated away from the diagonal line shown in FIG. 3, so that its slope changes slowly. Since $t_1$ is no longer equal to t and the bent path $t_2=t$, $t_1$ may be referred to as a warped time-scale. This action effectively results in stretching and squeezing the time axis differently at different times to "even-out" the period of the fast undulations. The new approach is called a warped multirate partial differential equation (WaMPDE).

This may be illustrated by returning to expression (3). Consider the following new multivariate representation:

$$\hat{x}_2(\tau_1,\tau_2)=\cos(2\pi \tau_1) \qquad (6)$$

together with the warping function $$\phi(\tau_2) = f_0 \tau_2 + \frac{k}{2\pi} \cos(2\pi f_2 \tau_2). \qquad (7)$$

The one-dimensional FM signal in expression (3) may now be retrieved as:

$$x(t)=\hat{x}_2(\phi(t),t). \qquad (8)$$

Note that both $\hat{x}_2$ and $\phi$, given in expressions (6) and (7), can be easily represented with relatively few samples, unlike $\hat{x}_1$ in expression (5). $\hat{x}_2$ and φ are plotted in FIG. 7 and FIG. 8, respectively. Note further that φ(t) is the sum of a linearly increasing term and a periodic term, hence its derivative is periodic. This periodic derivative is equal to the instantaneous frequency of x(t), given in expression (4). The significance of $$\frac{\partial \phi}{\partial t}$$

will be discussed shortly.

It is apparent that there is no unique bivariate form and warping function satisfying expression (8). For example, two representations $\hat{x}_1$ and $\hat{x}_2$ have already been given (the warping function for $\hat{x}_1$ is φ(t)=t). More generally, any warping function can be chosen, but at the possible cost of a resulting bivariate representation that cannot be sampled efficiently. To find an efficient bivariate representation, a crucial step in our approach is to avoid specifying the function φ(t) a priori, but to impose a smooth "phase condition" instead on the bivariate function and then use this to calculate φ. The phase condition can require that the phase of the $\tau_1$-variation of the function vary only slowly (or not at all) as $\tau_2$ is changed. Alternatively, a time-domain condition on the bivariate function (or a derivative) can be specified. As an illustration, consider the requirement that the $\tau_1$-derivative along the line $\tau_1$=0 be a slowly-varying function of $\tau_2$:

$$\frac{\partial \hat{x}_3(0, \tau_2)}{\partial \tau_1} = -2\pi \sin(2\pi f_2 \tau_2) \quad (9)$$

together with $$\hat{x}_3(\phi_3(t),t) = x(t) = \cos(2\pi f_0 t + k \cos(2\pi f_2 t)). \quad (10)$$

As is easily verified, these conditions lead to the following solutions for $\hat{x}_3$ and $\phi_3$:

$$\hat{x}_3(\tau_1,\tau_2) = \cos(2\pi\tau_1 + 2\pi f_2\tau_2) \quad (11)$$

$$\phi_3(t) = f_0 t + \frac{k}{2\pi}\cos(2\pi f_2 t) - f_2 t$$

Although $\hat{x}_3$ and $\phi_3$ are not identical to $\hat{x}_3$ and φ in expressions (6) and (7), they retain the desired property of being easy to sample.

When $\hat{x}_2$ and φ in expressions (6) and (7) are chosen to be the warped bivariate representation of x(t), the instantaneous frequency in expression (4) is the derivative of φ(t), as already noted. On the other hand, the derivative of $\phi_3(t)$ differs from the instantaneous frequency by the constant. Generally, all choices of φ(t) that result in compact representations will differ in their derivatives $$\frac{\partial \phi}{\partial t}$$

by amounts only of the order of the slow frequency $f_2$. When the fast frequency is much greater than the slow one, this difference is small compared to the instantaneous frequency in (4), and therefore the term local frequency for $$\frac{\partial \phi}{\partial t}$$

is justified. The utility of the local frequency is that it is well defined for any FM signal (e.g., even those with non-sinusoidal waveforms and varying amplitudes, not just the ideal one of expression (3)), while retaining the essential intuition of FM. The ambiguity in $$\frac{\partial \phi}{\partial t},$$

of order $f_2$, is quite reasonable, since the intuitive concept of frequency is only meaningful to the same order. It should be kept in mind that concepts of varying frequency make intuitive sense only when the fast and slow time scales are widely separated.

The time warping concept can also be understood in a different, visual, manner. The difficulty in using $\hat{x}_1$ of expression (5) is due to the fact that changing $t_2$ by even a small amount results in a large change in the phase of the outer cosine function, because k is large. Thus the function is the same on all lines parallel to the $t_1$ axis, except for a phase that differs substantially for even lines that are nearby. The representation problem that this causes can be dealt with by sliding these lines up and down in the $t_1$ direction until there is no variation (or slow variation) in the phase from one line to another. This results in changing the rectangular domain box of FIG. 2 to a non-rectangular one whose width is constant (i.e., with curved but parallel boundaries). In addition, the straight-line $t_1$=$t_2$ path changes to a curved path because of the phase adjustment. The doubly periodic bivariate representation can be obtained by tiling the $t_1$–$t_2$ plane with the curved domain boxes (possible because the width is constant). In fact, after extending the function to the entire plane, it is possible to redefine the domain box to be a rectangle once again, resulting in FIG. 7.

The previous discussion has summarized our basic strategy for representing FM efficiently. It now remains to concretize these notions in the framework of an arbitrary dynamical system defined by DAEs. This is accomplished by the WaMPDE, which is a partial differential equation similar to the MPDE, but with a multiplicative factor of $$\frac{\partial \phi}{\partial t}$$

modifying one of the differential terms. By solving the WaMPDE together with the phase condition mentioned above, compact representations of the solutions of autonomous systems can be found by efficient numerical methods.

Figure 9:
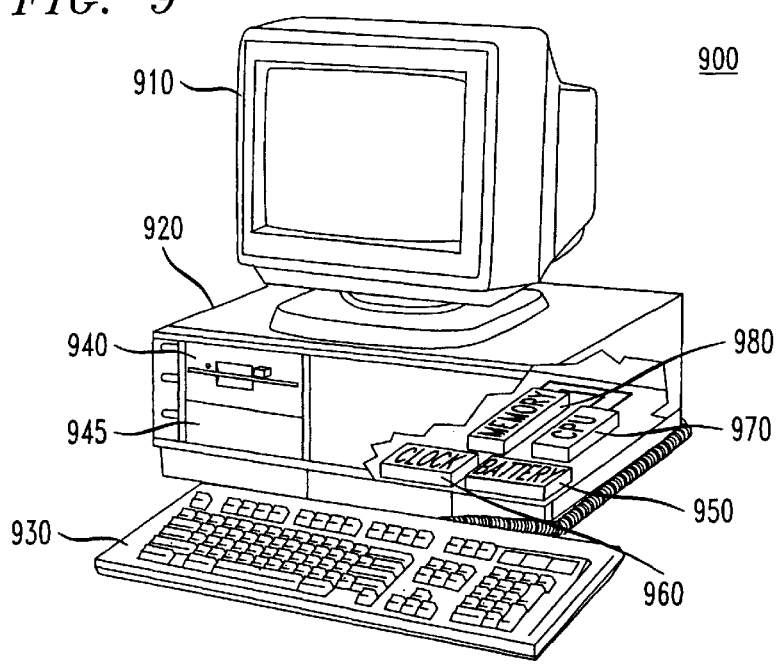
FIG. 9 illustrates an isometric view of a computer system.

Turning now to FIG. 9, illustrated is an isometric view of a computer system 900 which may incorporate one embodiment of the present invention. The computer system 900 may be a conventional personal computer ("PC"). The present invention need not be embodied in a computer system. Instead, another embodiment of the present invention may be incorporated into an embedded system.

The computer system 900 includes a monitor 910, a chassis 920 and a keyboard 930. Alternatively, the monitor 910 and the keyboard 930 may be replaced by other conventional output and input devices, respectively. The chassis 920 includes both a floppy disk drive 940 and a hard disk drive 945. The floppy disk drive 940 is employed to receive, read and write to external disks; the hard disk drive 945 is employed for fast access storage and retrieval. The floppy disk drive 940 may be replaced by or combined with other conventional structures to receive and transmit data and instructions, including without limitation, tape and compact disc drives, telephony systems and devices (including videophone, paging and facsimile technologies), and serial and parallel ports.

The chassis 920 is illustrated having a cut-away portion that includes a battery 950, a clock 960, a central processing unit ("CPU") 970 and a memory storage device 980. The processing circuitry of the present invention may be embodied in the CPU 970 and the other elements of the present invention may be embodied in the CPU 970 in combination with the memory storage device 980 and the chassis 920. Although the computer system 900 is illustrated having a single CPU 970, hard disk drive 945 and memory storage device 980, the computer system 900 may be equipped with a plurality of CPUs and peripheral devices.

It should be noted that the present invention is not limited to a conventional computer system having at least one CPU. Other embodiments of the present invention may be incorporated in hand-held, laptop/notebook, mini, mainframe and supercomputers, including RISC and parallel processing architectures, as well as within computer system network combinations. Conventional computer system architecture is more fully discussed in *Computer Organization and Architecture,* by William Stallings, MacMillan Publishing Co. (3rd ed. 1993) and incorporated herein by reference. Alternative computer system embodiments may be firmware or hardware based.

Figure 10:
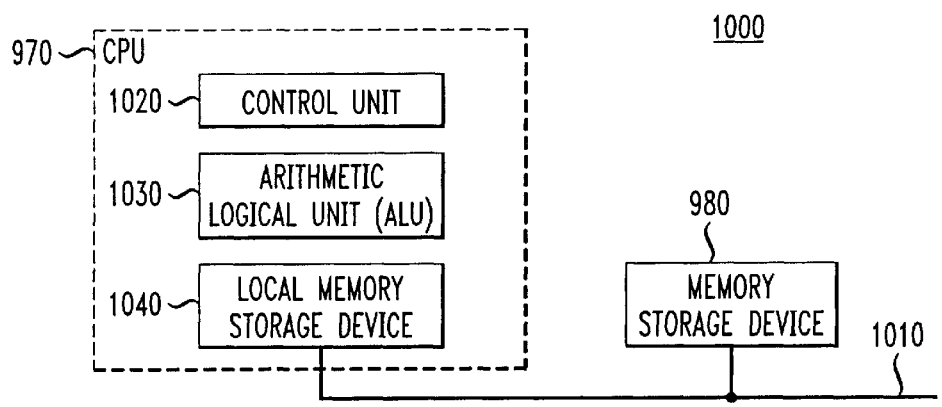
FIG. 10 illustrates a schematic block diagram of the CPU 970 of FIG. 9 incorporating an embodiment of the present invention.

Turning now to FIG. 10, illustrated is a schematic block diagram 1000 of the CPU 970 of FIG. 9 incorporating an embodiment of the present invention. The CPU 970 is coupled to the memory storage device 980 by a data bus 1010. The memory storage device 980 stores data and instructions that the CPU 970 uses to execute the functions necessary to operate the computer system 900. The memory storage device 980 may be any conventional memory storage device. The CPU 970 includes a control unit 1020, an arithmetic logic unit ("ALU") 1030 and a local memory storage device 1040 (e.g., a stackable cache, a plurality of registers, etc.). The control unit 1020 fetches the instructions from the memory storage device 980. The ALU 1030, in turn, performs a plurality of operations, including addition and Boolean AND, necessary to carry out the instructions fetched from the memory storage device 980. The local memory storage device 1040 provides a local high speed storage location for storing temporary results and control information generated and employed by the ALU 1030. Again, the processing circuitry of the present invention is embodied in the CPU 970 and the other elements of the present invention may be embodied in the CPU 970 in combination with the memory storage device 980. The present invention is not limited to one type of CPU. Other embodiments of the present invention may use different types of CPUs or dedicated processor types.

Figure 11:
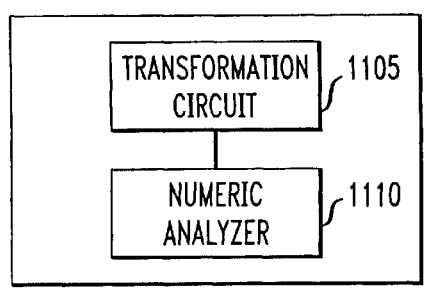
FIG. 11 illustrates a system for analyzing a forced or unforced oscillator constructed according to the principles of the present invention.

Turning now to FIG. 11, illustrated is a system 1100 for analyzing a forced or unforced oscillator constructed according to the principles of the present invention. In the present embodiment, the system 1100 includes a transformation circuit 1105 that transforms a frequency-modulated (FM) waveform representing an output of the oscillator into a function based on at least two time scales, and a numeric analyzer 1110, associated with the transformation circuit 1105, that warps at least one of two time scales and thereafter numerically analyzes the function to determine a frequency thereof. Recall, that the term warps means to stretch or squeeze the time axis by different amounts at different times in order to make the density of the oscillator output waveform undulations uniform.

The system 1100 of the present embodiment also includes a general method of solution for the oscillator being either forced or unforced. The oscillator, in the illustrated embodiment, is a voltage controlled oscillator wherein its FM waveform consisting of a plurality of voltage samples and represented by at least one equation is applied to the transformation circuit 1105. The function of the FM oscillator waveform is transformed by the transformation circuit 1105 and is represented as a multirate partial differential equation that is applied to a warped time function or a WaMPDE, as introduced earlier. The numeric analyzer 1110 analyzes the WaMPDE using a Fourier transform and may also encompass time-domain analysis, as appropriate to the solution. In the present embodiment, a first of two time scales is at least three times faster than a second of two time scales. In one embodiment of the present invention, the time scales are separated greatly, being on the order of 50 times.

The present invention therefore introduces the broad concept of allowing at least one of multiple time scales to vary (i.e., warp). Warping of the time scale causes the oscillator output waveform to become quasiperiodic, greatly reducing the numeric analysis required to determine frequencies. Also, warping of the time scale substantially eliminates the error that results from approximations based upon a fixed time scale by rendering these types of approximations unnecessary. Of course, those skilled in the pertinent art will perceive a wide variety of electrical, mechanical, gravitational and biological applications for the system and method of the present invention.

The WaMPDE may be used for solving systems with forced autonomous components. An important feature of the WaMPDE is its ability to capture frequency modulation in a natural and compact manner. This is made possible by the key new concept of using warped time that is related to normal time through separate time scales. Using warped time, a completely general formulation that captures complex dynamics in autonomous nonlinear systems of arbitrary size or complexity is obtained. Computationally efficient numerical methods for solving large practical problems using the WaMPDE are presented. The system and method explicitly calculate a time-varying local frequency that matches intuitive expectations.

The WaMPDE is both a new system and method for analyzing a large class of forced and unforced oscillatory systems. The system and method are useful for both analytical and numerical purposes. The WaMPDE provides a unified framework within which to understand quasiperiodicity (particularly frequency modulation), mode-locking and period multiplication, and even some chaotic modes of forced oscillators thereby enlarging and unifying the understanding of forced oscillatory systems.

A key aspect of the method is a compact representation of frequency modulation signals using functions of several time variables, wherein some are warped. The essence of the time warping concept is to take a frequency modulated signal and stretch or squeeze the time axis by different amounts at different times to make the density of the signal undulations uniform. The variation of this stretching is much slower than the undulations themselves. Hence, a multiple time system and method are used to separate the time scales.

An important feature of the WaMPDE is that it automatically and explicitly determines the local frequency as it changes with time. Further, our system and method also eliminates the problem of growing phase error that limits previous numerical techniques for oscillators. Amplitude modulation quasiperiodicity, mode-locking and period multiplication emerge naturally as special cases. Numerical computations for the WaMPDE can be performed using time-domain or frequency-domain methods, or combinations of the two. In particular, existing codes for previous methods like the MPDE and harmonic balance can be modified easily to perform WaMPDE-based calculations.

A nonlinear system may be modeled using vector differential-algebraic equations (DAEs). A description adequate for circuits and many other applications may be described by:

$$\frac{d}{dt}q(x(t)) + f(x(t)) = b(t) \tag{12}$$

In a circuit context, $x(t)$ is a vector of node voltages and branch currents, and $q(\ )$ and $f(\ )$ are nonlinear functions describing the charge/flux and resistive terms, respectively. The variable $b(t)$ is a vector forcing term consisting of inputs, which are usually independent voltage or current sources.

The $(p+1)$-dimensional WaMPDE may be defined to be:

$$\sum_{i=1}^{p}\left(\omega_i(\tau_{p+1})\frac{\partial q(\hat{x})}{\partial \tau_i}\right) + \frac{\partial q(\hat{x})}{\partial \tau_{p+1}} + f(\hat{x}) = \hat{b}(\tau_1, \cdots, \tau_{p+1}). \tag{13}$$

$\tau_1, \ldots \tau_p$ are p warped time scales, while $\tau_{p+1}$ is an unwarped time scale. Each warped time variable has an associated frequency function $\omega_i(\tau_{p+1})$, which depends on the unwarped time variable. $\hat{x}_1$ and $\hat{b}_1$ are multivariate functions of the $p+1$ time variables. These quantities represent generalizations of the concepts introduced previously where each warped time corresponds to an independent FM mode of the system and the unwarped one represents a non-FM time scale. It is straightforward to extend expression (13) to more than one unwarped time scale.

The utility of expression (13) lies in its special relationship with expression (12). Consider any solution $\hat{x}_1$ of expression (13), together with the condition $$b(t)=\hat{b}(\phi_1(t), \ldots, \phi_p(t),t), \phi_i(t)\int_0^t \omega_i(\tau)d\tau. \tag{14}$$

If we define the function $x(t)$ as $$x(t)=\hat{x}(\phi_1(t), \ldots, \phi_p(t),t), \tag{15}$$

then one can show by substitution that $x(t)$ satisfies expression (12). Hence, if we can find any solution of expression (13), we have automatically found one for the original problem expression (12). Solving the WaMPDE directly for the multivariate functions can be advantageous.

For concreteness in the following, we now specialize to the case when there are only two time variables, and the function b is used directly in expression (13):

$$\omega(\tau_2)\frac{\partial q(\hat{x})}{\partial \tau_1} + \frac{\partial q(\hat{x})}{\partial \tau_2} + f(\hat{x}(\tau_1, \tau_2)) = b(\tau_2). \tag{16}$$

Corresponding to expressions (14) and (15), specifying $$x(t)=\hat{x}(\phi(t),t), \phi(t)=\int_0^t \omega(\tau_2)d\tau_2 \tag{17}$$

results in $x(t)$ being a solution to expression (12).

Next, expression (16) can be solved to determine $\hat{x}(\tau_1,\tau_2)$ and $\omega(\tau_2)$. First assume that $\hat{x}(\tau_1,\tau_2)$ is periodic in $\tau_1$ with period 1:

$$\hat{x}(\tau_1, \tau_2) = \sum_{i=-\infty}^{\infty} \hat{x}_i(\tau_2)e^{ji\tau_1} \tag{18}$$

Note that if $\hat{x}(\tau_1,\tau_2)$ satisfies expression (16), then so does $\hat{x}(\tau_1+\Delta,\tau_2)$, for any $\Delta\epsilon R$. This is because expression (16) is autonomous in the $\tau_1$ time scale. This ambiguity may be removed in the same way as for unforced autonomous systems. That is, by fixing the phase of the $k^{th}$ variable to some value, for example zero. This is the phase constraint previously mentioned.

Expanding expression (16) in a one-dimensional Fourier series in $T_1$ and also including the phase constraint, one may obtain:

$$\sum_{i=-\infty}^{\infty}\left(\frac{\partial \hat{Q}_i(\tau_2)}{\partial \tau_2} + ji\omega(\tau_2)\hat{Q}_i(\tau_2) + \hat{F}_i(\tau_2)\right)e^{ji\tau_1} = b(\tau_2) \tag{19}$$

$$\Im\{\hat{X}_l^k(\tau_2)\} = 0 \tag{20}$$

$\hat{Q}_i(\tau_2)$ and $\hat{F}_i(\tau_2)$ are the Fourier coefficients of $q(\hat{x}(\tau_1,\tau_2))$ and $f(\hat{x}(\tau_1,\tau_2))$, respectively. k and l are fixed integers; $\hat{x}_l^k(\tau_2)$ denotes the $l^{th}$ Fourier coefficient of the $k^{th}$ element of $\hat{x}_1$.

Expressions (19) and (20) together form a DAE system which can be solved for isolated solutions. In practice, the Fourier series expression (19) can be truncated to $N_0=2M+1$ terms with i restricted to M, . . . , M. In this case, expressions (19) and (20) lead to $N_0+1$ equations in the same number of unknown functions of $\tau_2$. Applying periodic or initial boundary conditions to the DAE system expressions (19) and (20) leads to quasiperiodic or envelope modulated FM solutions. Also, this situation captures other interesting phenomena like mode locking and period multiplication.

First, consider periodic boundary conditions. Assume $b(t)$ periodic with period $T_2$ or angular frequency $$\omega_2 = \frac{2\pi}{T_2}.$$

Also assume that the solution of expression (16) is periodic in both arguments (i.e., $\hat{x}(\tau_1,\tau_2)$ is $(1,T_2)$-periodic and $\omega(\tau_2)$ is $T_2$-periodic). $\omega(\tau_2)$ can then be written as:

$$\omega(\tau_2)=\omega_0+p'(\tau_2) \tag{21}$$

where $\omega_0$ is a constant and $p'(.)$ is a zero-mean $T_2$-periodic waveform. Using expressions (21) and (17), one obtains an expression for $\phi$:

$$\phi(t)=\omega_0 t+p(t) \tag{22}$$

where $p(t)$ is a $T_2$-periodic function. These assumptions are motivated by showing that such periodic forms for $\hat{x}(.,.)$ and $\omega(.)$ both FM- and AM-quasiperiodicity, mode-locking and period multiplication.

Expanding $\hat{x}(\tau_1,\tau_2)$ in a Fourier series:

$$\hat{x}(\tau_1, \tau_2) = \sum_{i,k=-\infty}^{\infty} \hat{X}_{ik} e^{ji\tau_1} e^{jk\omega_2\tau_2} \tag{23}$$

where the constants $\hat{X}_{i,k}$ are Fourier coefficients. Substituting expression (23) into expression (17), one obtains:

$$x(t) = \sum_{i,k=-\infty}^{\infty} \hat{X}_{i,k} e^{ji(\omega_0 t + p(t))} e^{jk\omega_2 t} \qquad (24)$$

Consider, for example, the term of expression (24) with i=1 and k=0:

$$\hat{X}_{1,0} e^{j(\omega_0 t + p(t))} = \hat{X}_{1,0} \cos(\omega_0 t + p(t)) + j\hat{X}_{1,0} \sin(\omega_0 t + p(t)) \qquad (25)$$

When a $\omega(t)$ is non-trivially $T_2$-periodic, p(t) is also non-trivially $T_2$-periodic. Expression (25) can then readily be recognized to be a frequency-modulated signal with instantaneous frequency $\omega(t)$. Hence the WaMPDE with periodic solutions can capture not only FM is signals, but also the more general form of expression (24).

One can show that various special cases of $\omega(.)$ correspond to physical situations of interest. When $\omega(.)$ is simply some constant, that is p'(.)=0, then the time-domain solution expression (24) has no frequency modulation, but is AM-quasiperiodic with angular frequencies $\omega_0$ and $\omega_0$ and $\omega_2$. If $\omega_0=\omega_2$, the response has the same period as the external forcing frequency, and the system is mode-locked or entrained. If $\omega_0$ is a sub-multiple of $\omega_2$, the period of the response is a multiple of that of the forcing. This phenomenon of period multiplication is often a designed parameter for frequency dividing circuits and also may be observed in dynamic systems en route to chaos.

Expressions (19) and (20), with periodic boundary conditions, can be turned into a set of nonlinear equations for numerical solution. Expressions (19) and (20) are converted to discrete samples at $N_1$ points along the $t_2$ axis covering the interval $[0,T_1]$. The differentiation operator is replaced by a numerical differentiation formula (e.g., Backward Euler or Trapezoidal). When the periodic boundary condition $\hat{X}_i(0)=\hat{X}_i(T_1)$ is applied, a system of $N_1(N_0+1)$ nonlinear algebraic equations in $N_1(N_0+1)$ unknowns is obtained. This set of equations is solved with any numerical method for nonlinear equations, such as Newton-Raphson or continuation, to obtain the solution of the WaMPDE. Further, when iterative linear algebra and factored-matrix methods are employed, computation and memory requirements grow almost linearly with size, making calculations practical for even large systems.

For additional background information see: *Iterative Methods for Sparse Linear Systems*, by Y. Saad, PWS, Boston, 1996; *Reduced-order Modeling Techniques Based on Krylov Subspaces and Their Use in Circuit Simulation*, by R. Freund, Technical Report 11273-980217-02TM, Bell Laboratories, 1998; *Efficient Multi-tone Distortion Analysis of Analog Integrated Circuits*, by R. C. Melville, P. Feldmann, and J. Roychowdhury, In Proc. IEEE CICC, pages 241–244, May 1995; *Efficient Frequency Domain Analysis of Large Nonlinear Analog Circuits*, by P. Feldmann, R. C. Melville, and D. Long, In Proc. IEEE CICC, May 1996; and *Cyclostationary Noise Analysis of Large RF Circuits with Multitone Excitations*, by J. Roychowdhury, D. Long, and P. Feldmann, IEEE J. Solid-State Ckts., 33(2):324–336, March 1998. The foregoing publications are incorporated herein by reference.

By applying initial conditions rather than periodic boundary conditions, expressions (19) and (20) can be solved for aperiodic ($\{\hat{X}_i(\tau_2)\}, \omega(\tau_2)$). These envelope-modulated solutions can be useful for investigating transient behaviour in FM systems. To obtain envelope solutions, expressions (19) and (20) are solved by time-stepping in $t_2$ using any DAE solution method, starting from $t_2=0$. An initial condition ($\{\hat{X}_i(0)\}, \omega(0)$) is specified. For typical applications, a natural initial condition is the solution of expression (12) with no forcing, i.e., with b(t) constant. The procedure for discretizing of the WaMPDE for quasiperiodic or time-stepping solutions is similar to that for the MPDE. Additional background information is discussed in *Analyzing Circuits with Widely-Separated Time Scales using Numerical PDE Methods*, by J. Roychowdhury, IEEE Trans. Ckts. Syst.—I: Fund. Th. Appl., 1998. The foregoing publication is incorporated herein by reference.

Figure 12:
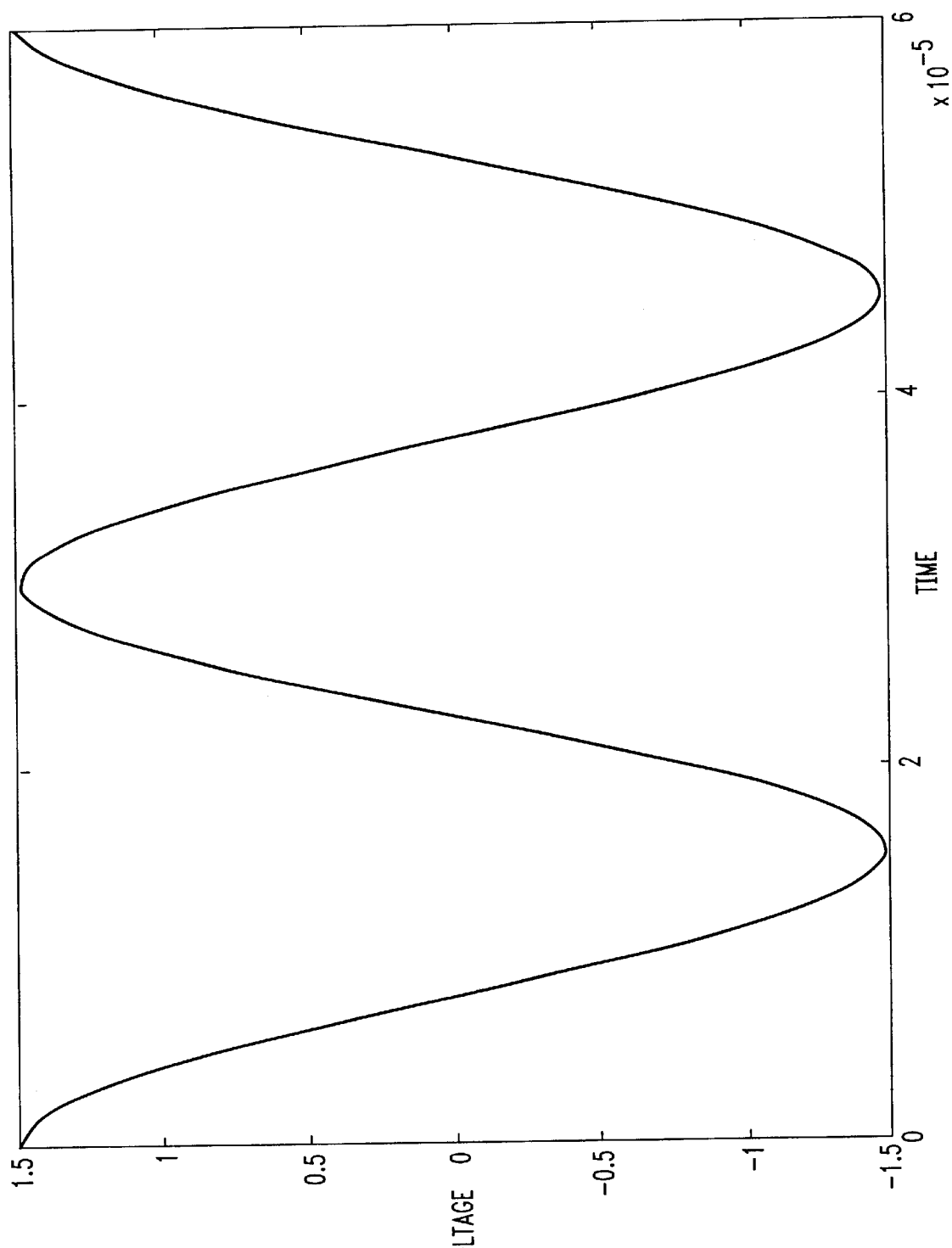
FIG. 12 illustrates a waveform showing a sinusoidal control voltage for a voltage-controlled oscillator (VCO)
Figure 13:
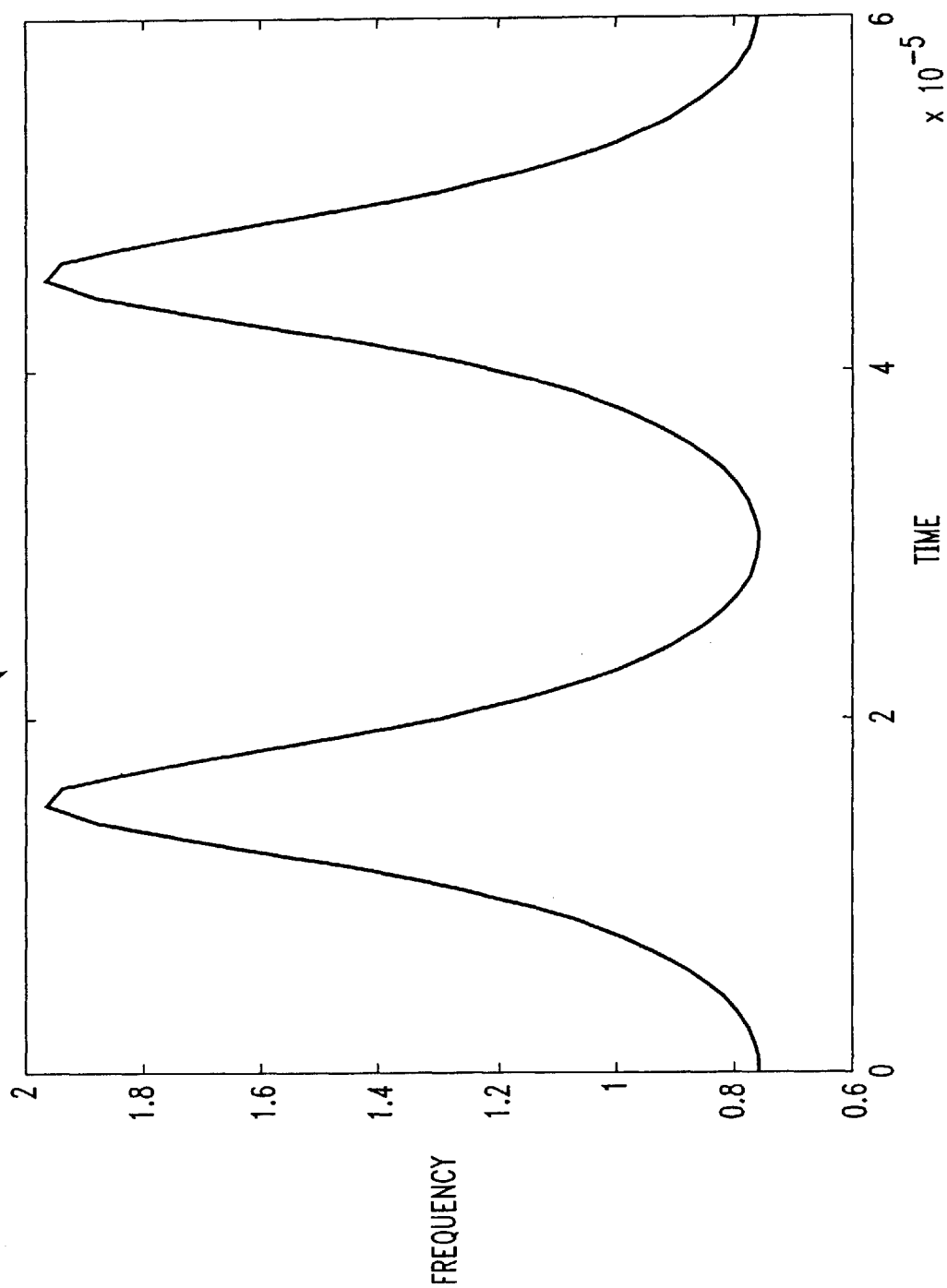
FIG. 13 illustrates a waveform showing a resulting change in local frequency of the VCO of FIG. 12.

Turning now to FIG. 12 and FIG. 13, illustrated are a waveform 1200 showing a sinusoidal control voltage for a voltage-controlled oscillator (VCO) and a waveform 1300 showing a resulting change in local frequency of the VCO, respectively. The VCO may be simulated using WaMPDE-based numerical techniques. The VCO consists of an LC tank circuit in parallel with a nonlinear resistor, whose resistance is negative in a region about zero and positive elsewhere leading to a stable limit cycle. The capacitance may be varied by adjusting the physical plate separation of a micro electromechanical structure (MEMS) varactor utilizing a separate control voltage, as shown. The damping parameter of the mechanical structure is assumed to be small.

An envelope simulation may be conducted using purely time-domain numerical techniques for both $\tau_1$ and $\tau_2$ axes. An initial control voltage of 1.5 volts results in an initial frequency of about 0.75 MHz. FIG. 12 shows the variation of the sinusoidal control voltage having a time period of 30 times that of the unforced oscillator. FIG. 13 shows the resulting change in local frequency of the VCO, which varies by a factor of at least three.

Figure 14:
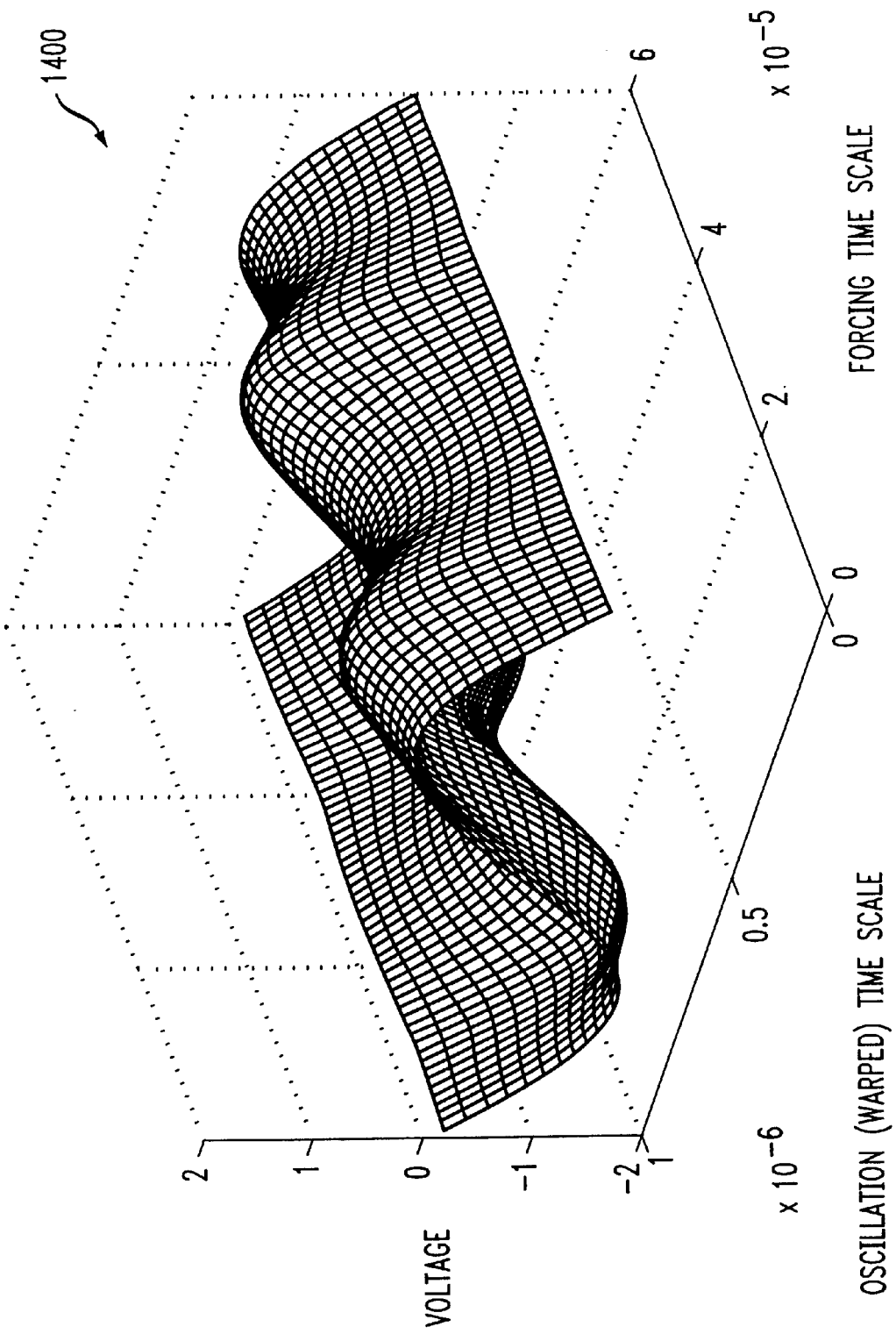
FIG. 14 illustrates a waveform showing a bivariate representation of a capacitor voltage for the VCO of FIG. 12.

Turning now to FIG. 14, illustrated is a waveform 1400 showing a bivariate representation of a capacitor voltage for the VCO of FIG. 12. FIG. 14 depicts the bivariate waveform of the capacitor voltage (i.e., one entry of the vector $\hat{x}(\tau_1,\tau_2)$), with the warped $\tau_1$ axis scaled to the oscillator's nominal time-period of 1 $\mu$s). It may be seen that the controlling voltage changes not only the local frequency, but also the amplitude and shape of the oscillator waveform.

Figure 15:
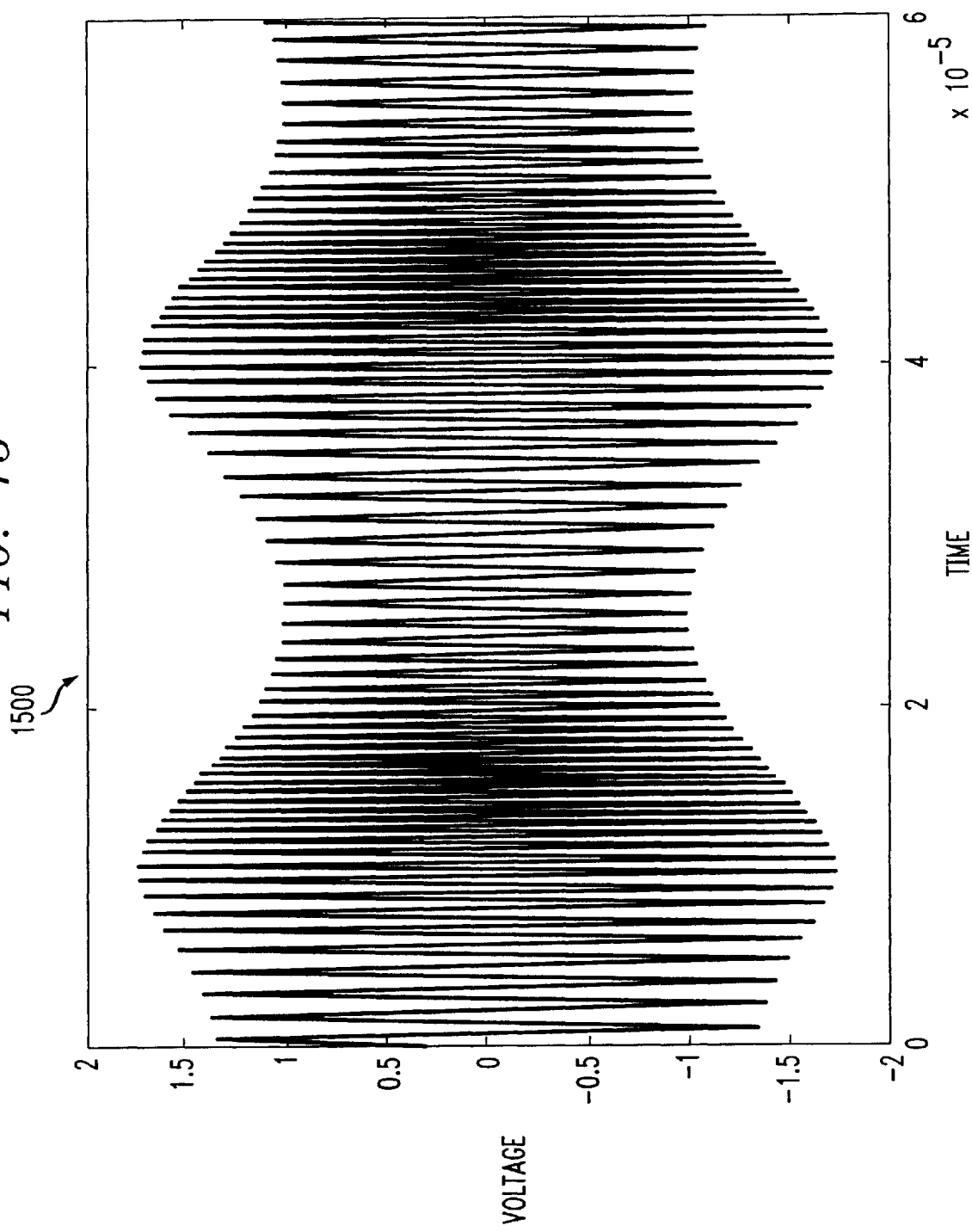
FIG. 15 illustrates a plot of two overlapping VCO waveforms showing a transient simulation vs. a WaMPDE solution.

Turning now to FIG. 15, illustrated is a plot of two overlapping VCO waveforms showing a transient simulation vs. a WaMPDE solution. FIG. 15 compares the VCO circuit simulated by traditional numerical ODE methods ("transient simulation") together with the one-dimensional waveform obtained by applying expression (15) to the waveform 1400 of FIG. 14. The match is so close that it is difficult to tell the two waveforms apart. However, the waveform lines at about 60 $\mu$s indicates a deviation of the transient result from the WaMPDE solution. Frequency modulation can be observed in the varying density of the undulations.

Figure 16:
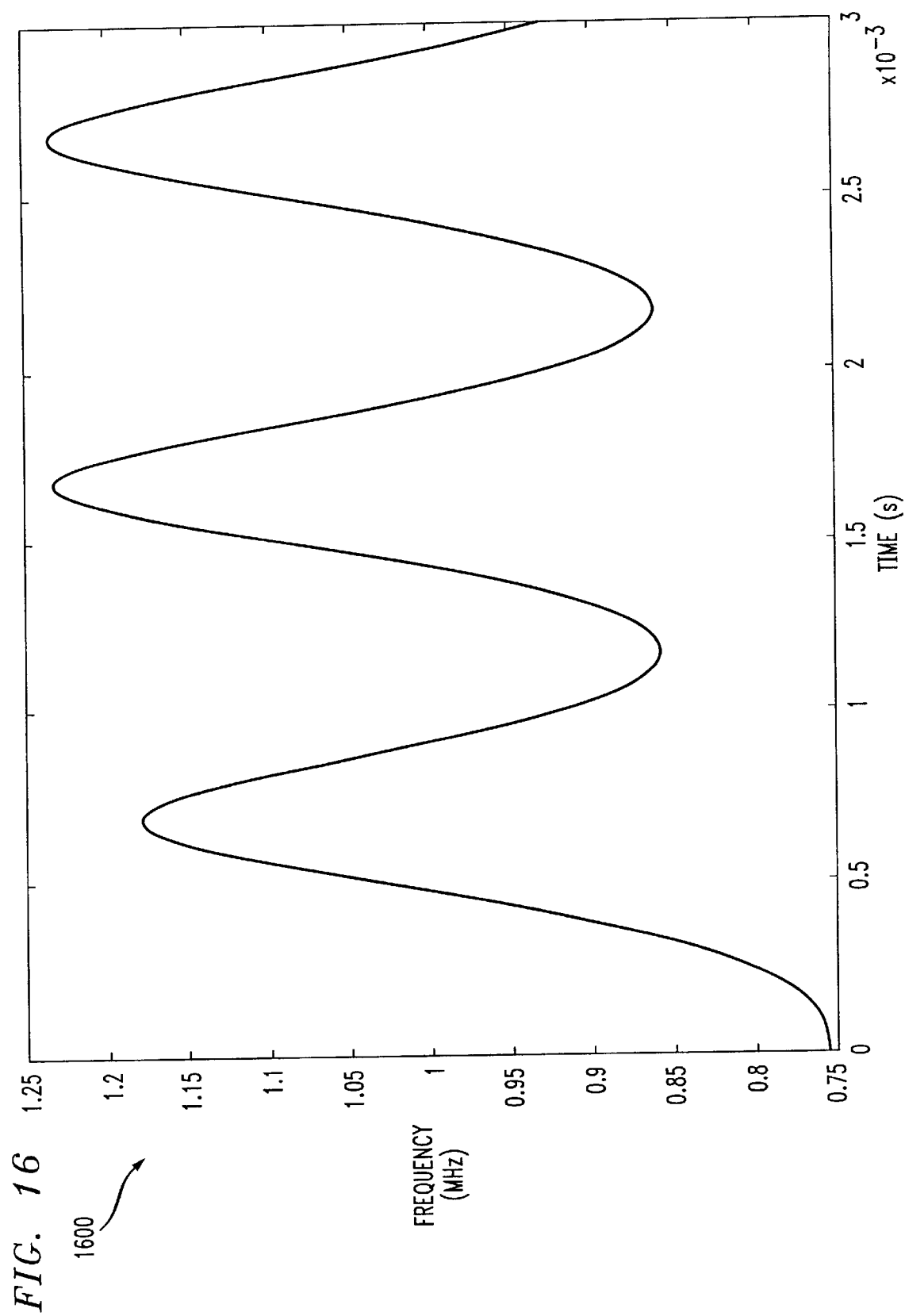
FIG. 16 illustrates a waveform showing a frequency modulation of a modified VCO simulation.

Turning now to FIG. 16, illustrated is a waveform 1600 showing a frequency modulation of a modified VCO simulation. The VCO simulation has been altered by increasing the damping of the MEMS varactor to correspond to an air-filled cavity, and the controlling voltage has been varied much more slowly (i.e., about 1000 times slower than the nominal period of the oscillator). The controlling voltage is the same sinusoid shown in FIG. 12, but with a period of 1 ms. FIG. 16 shows the new variation in frequency. The settling behavior and the smaller change in frequency may be noted due to the slow dynamics of the air-filled varactor.

Figure 17:
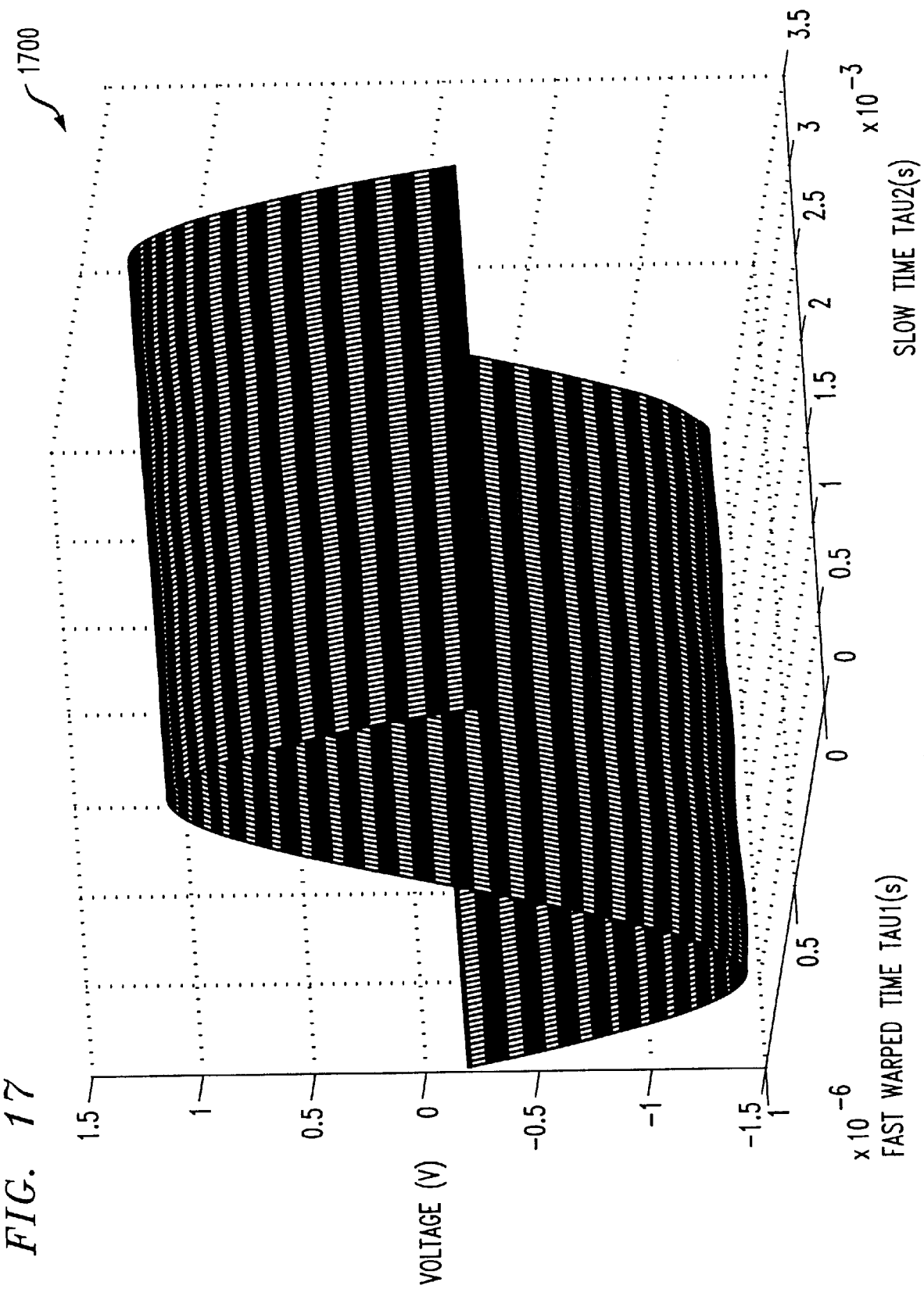
FIG. 17 illustrates a waveform showing a new bivariate capacitor voltage waveform.

Turning now to FIG. 17, illustrated is a waveform 1700 showing a new bivariate capacitor voltage waveform. Note that unlike the waveform 1400 of FIG. 14, the amplitude of the oscillation changes very little due to being forced. This has been corroborated by transient simulation, the full results of which are not depicted due to the density of the fast oscillations.

Figure 18:
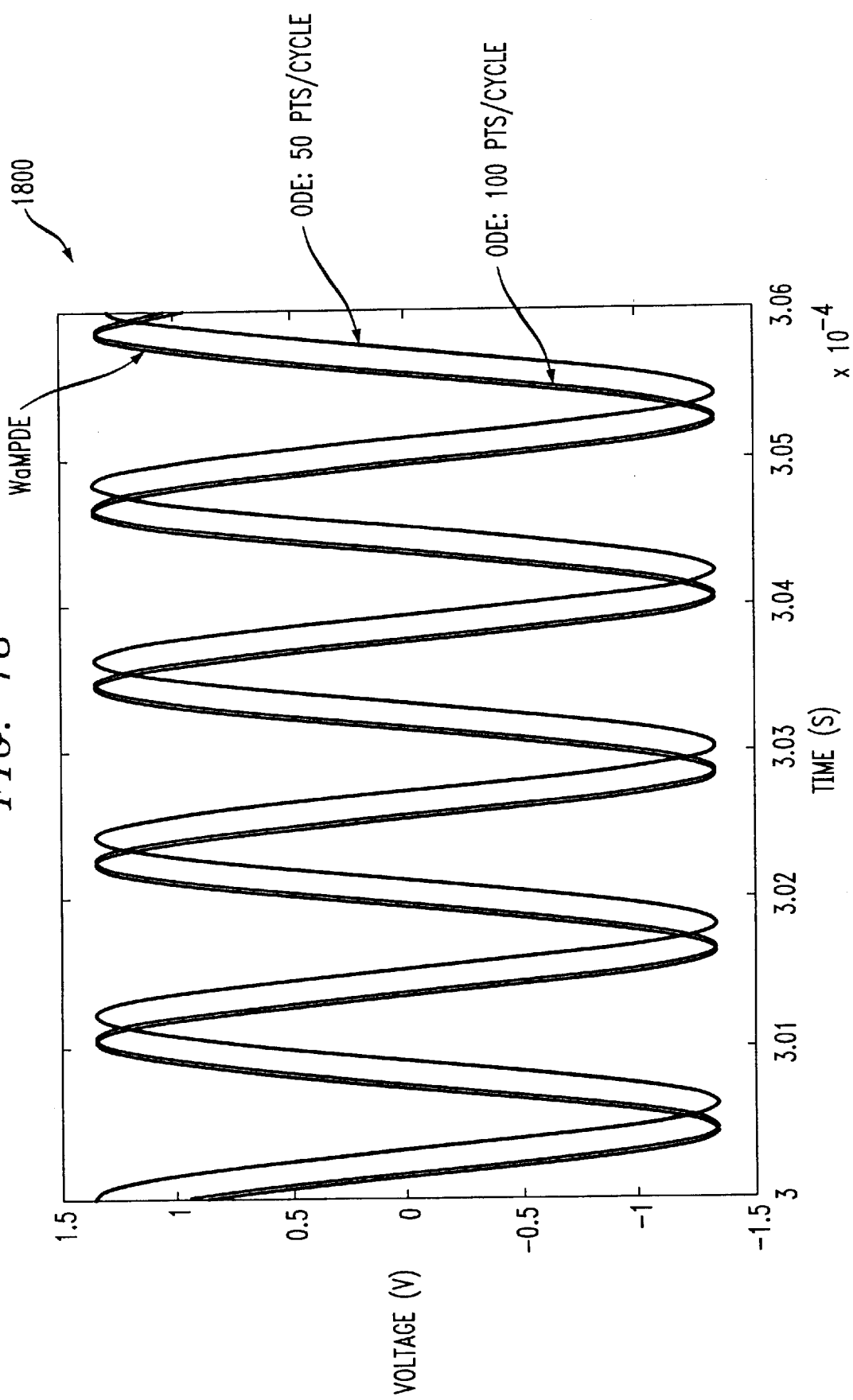
FIG. 18 illustrates a suite of waveforms of three modified VCO waveforms consisting of a few cycles around a 0.3 ms time frame.

Turning now to FIG. 18, illustrated is a suite of waveforms 1800 of three modified VCO waveforms consisting of a few cycles around a 0.3 ms time frame. The one-dimensional WaMPDE output of expression (14) is compared against two runs of direct transient simulation, using 50 and 100 points per nominal oscillation period, respectively. It can be seen that even at an early stage of the simulation, direct transient simulation with 50 sample points per cycle builds up a significant phase error. This is reduced considerably when 100 sample points are taken per cycle, but as the time frame increases (not shown) the error accumulates again, reaching many multiples of two by the end of the simulation at 3 ms. In contrast, the WaMPDE approach achieves much tighter control on phase because the phase condition (a time-domain equivalent of expression (20)) explicitly prevents build-up of error. To achieve accuracy comparable to the WaMPDE approach, transient simulation would require 1000 sample points per nominal cycle, with a resulting speed disadvantage of two orders of magnitude.

In summary, a new, efficient, system and method for analyzing the dynamics of oscillatory systems has been described. The system and method use multiple time scales and time warping functions to obtain a partial differential formulation (the WaMPDE) for autonomous dynamical systems. Solving the WaMPDE by efficient numerical methods enables the prediction of complex phenomena, such as frequency modulation, in large autonomous systems both quickly and accurately. The notion of instantaneous frequency has been extended to general settings and methods have been provided for calculating it explicitly. The methods were applied to VCO circuits and shown that they have significant speed and accuracy advantages over previously existing techniques.

Although the present invention has been described in detail, those skilled in the art should understand that they can make various changes, substitutions and alterations herein without departing from the spirit and scope of the invention in its broadest form.

What is claimed is:

1. A system for analyzing an oscillator, comprising:
   a transformation circuit that transforms a frequency-modulated waveform representing an output of said oscillator into a function based on at least two time scales; and
   a numeric analyzer, associated with said transformation circuit, that warps at least one of said at least two time scales and thereafter numerically analyzes said function to determine a frequency thereof, wherein said numeric analyzer analyzes said function by performing a Fourier transform thereon.

2. The system as recited in claim 1 wherein a first of said at least two time scales is at least three times faster than a second of said at least two time scales.

3. The system as recited in claim 1 wherein said function is a multirate partial differential equation.

4. The system as recited in claim 1 wherein said frequency-modulated waveform comprises a plurality of voltage samples.

5. The system as recited in claim 1 wherein said oscillator is a forced oscillator.

6. The system as recited in claim 1 wherein said oscillator is a voltage controlled oscillator.

7. A method of analyzing an oscillator, comprising:
   transforming a frequency-modulated waveform representing an output of said oscillator into a function based on at least two time scales;
   warping at least one of said at least two time scales; and
   thereafter numerically analyzing said function to determine a frequency thereof, wherein said analyzing comprises performing a Fourier transform on said function.

8. The method as recited in claim 7 wherein a first of said at least two time scales is at least three times faster than a second of said at least two time scales.

9. The method as recited in claim 7 wherein said function is a multirate partial differential equation.

10. The method as recited in claim 7 wherein said frequency-modulated waveform comprises a plurality of voltage samples.

11. The method as recited in claim 7 wherein said oscillator is a forced oscillator.

12. The method as recited in claim 7 wherein said oscillator is a voltage controlled oscillator.

13. A system for analyzing a forced oscillator, comprising:
   a transformation circuit that transforms a frequency-modulated waveform representing an output of said oscillator into a function based on at least two time scales, thereby rendering said waveform quasiperiodic; and
   a numeric analyzer, associated with said transformation circuit, that warps at least one of said at least two time scales and thereafter numerically analyzes said function to determine a frequency thereof, wherein said numeric analyzer analyzes said function by performing a Fourier transform thereon.

14. The system as recited in claim 13 wherein a first of said at least two time scales is at least three times faster than a second of said at least two time scales.

15. The system as recited in claim 13 wherein said function is a multirate partial differential equation.

16. The system as recited in claim 13 wherein said frequency-modulated waveform comprises a plurality of voltage samples.

17. The system as recited in claim 13 wherein said oscillator is a voltage controlled oscillator.

* * * * *